(12) United States Patent
Lu

(10) Patent No.: US 11,062,994 B2
(45) Date of Patent: Jul. 13, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/512,140

(22) Filed: Jul. 15, 2019

(65) Prior Publication Data
US 2021/0020579 A1  Jan. 21, 2021

(51) Int. Cl.
*H01L 23/532* (2006.01)
*H01L 23/485* (2006.01)
*H01L 23/482* (2006.01)
*H01L 21/768* (2006.01)

(52) U.S. Cl.
CPC .... *H01L 23/53238* (2013.01); *H01L 21/7685* (2013.01); *H01L 23/485* (2013.01); *H01L 23/4827* (2013.01)

(58) Field of Classification Search
CPC ............. H01L 21/7685; H01L 23/4827; H01L 23/485; H01L 23/53238
See application file for complete search history.

(56) References Cited

U.S. PATENT DOCUMENTS

| | | | |
|---|---|---|---|
| 6,352,879 B1* | 3/2002 | Fukui | H01L 21/561 438/106 |
| 6,747,348 B2 | 6/2004 | Jeung et al. | |
| 2003/0006493 A1* | 1/2003 | Shimoishizaka | H01L 24/24 257/686 |
| 2006/0139893 A1* | 6/2006 | Yoshimura | H01L 24/49 361/735 |
| 2011/0304041 A1 | 12/2011 | Chung | |

* cited by examiner

*Primary Examiner* — Allan R Wilson
(74) *Attorney, Agent, or Firm* — Foley & Lardner

(57) ABSTRACT

A semiconductor device package includes a substrate and an electronic component disposed on the substrate. The electronic component has an active surface facing away from the substrate. The substrate has a first conductive pad and a second conductive pad disposed thereon. The electronic component has a first electrical contact and a second electrical contact disposed on the active surface. The semiconductor device package further includes a first metal layer connecting the first electrical contact with the first conductive pad, a second metal layer connecting the second electrical contact with the second conductive pad, a first seed layer disposed below the first metal layer; and a first isolation layer disposed between the first metal layer and the second metal layer. A method of manufacturing a semiconductor device package is also disclosed.

15 Claims, 29 Drawing Sheets

SEMICONDUCTOR DEVICE PACKAGE AND METHOD OF MANUFACTURING THE SAME

BACKGROUND

1. Technical Field

The present disclosure generally relates to a semiconductor device package and a method of manufacturing the same, and to a semiconductor device package including metal layers and seed layers for bonding conductive pads.

2. Description of the Related Art

In semiconductor device packaging operations, an electronic component is attached to a substrate by forming an adhesive layer on the substrate followed by wire-bonding techniques or tape-bonding techniques to complete electrical signal interconnections between the electronic component and the substrate. However, as the package becomes thinner and thinner, or when more chips are stacked in a package, some drawbacks may become serious, such as breaking of bonding wires, constrained minimum loop heights, parasitic effect, and so forth.

SUMMARY

In one or more embodiments, a semiconductor device package includes a substrate and an electronic component disposed on the substrate. The electronic component has an active surface facing away from the substrate. The substrate has a first conductive pad and a second conductive pad disposed thereon. The electronic component has a first electrical contact and a second electrical contact disposed on the active surface. The semiconductor device package further includes a first metal layer connecting the first electrical contact with the first conductive pad, a second metal layer connecting the second electrical contact with the second conductive pad, a first seed layer disposed below the first metal layer; and a first isolation layer disposed between the first metal layer and the second metal layer.

In one or more embodiments, a semiconductor device package includes a substrate having a first conductive pad and a first electronic component disposed on the substrate. The first electronic component has a first active surface facing away from the substrate. The semiconductor device package further includes a second electronic component disposed on the first active surface of the first electronic component. The second electronic component has a second active surface facing away from the first electronic component. The second electronic component has an electrical contact disposed on the second active surface. The semiconductor device package further includes a first metal layer which connects the electrical contact of the second electronic component with the first conductive pad. The first metal layer is isolated from the first electronic component.

In one or more embodiments, a method for manufacturing a semiconductor device package includes providing a substrate having a first conductive pad and a second conductive pad disposed thereon, and disposing a first electronic component on the substrate. The first electronic component has a first active surface facing away from the substrate. The electronic component has a first electrical contact and a second electrical contact disposed on the active surface. The method further includes forming a first metal layer connecting the first electrical contact with the first conductive pad and forming a second metal layer connecting the second electrical contact with the second conductive pad. The method further includes forming a first seed layer disposed below the first metal layer. The method further includes forming a first isolation layer disposed between the first metal layer and the second metal layer.

BRIEF DESCRIPTION OF THE DRAWINGS

Aspects of the present disclosure are readily understood from the following detailed description when read with the accompanying figures. It should be noted that various features may not necessarily be drawn to scale. Dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
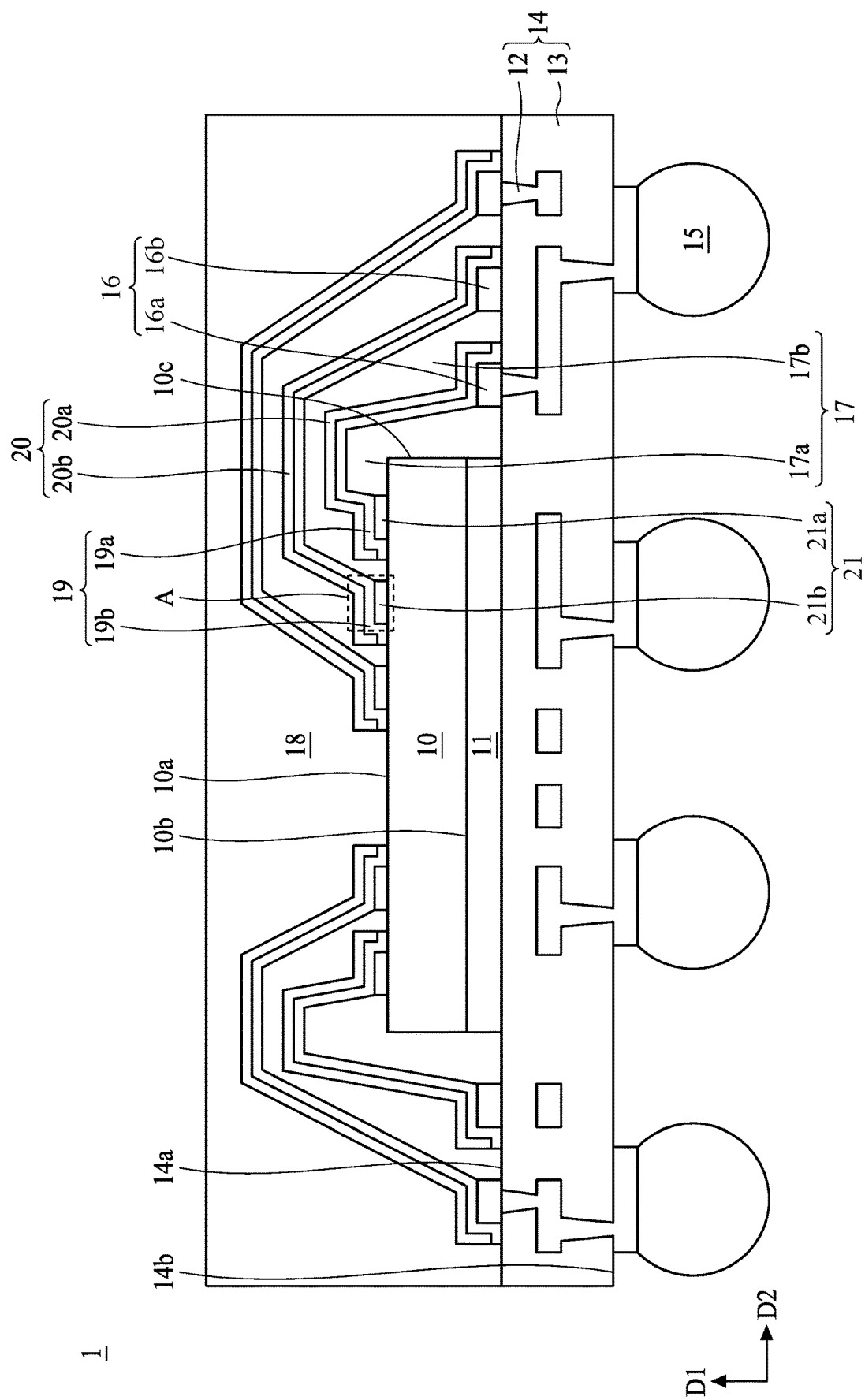
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity, and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes an electronic component 10, a substrate 14, electrical contacts 15, conductive pads 16, electrical contacts 21, isolation layers 17, an encapsulating layer 18, seed layers 19, and metal layers 20.

The substrate 14 may be, for example, a printed circuit board, such as a paper-based copper foil laminate, a composite copper foil laminate, or a polymer-impregnated glass-fiber-based copper foil laminate. The substrate 14 may include an interconnection structure 12, such as a redistribution layer (RDL) or a grounding element. The substrate 14 has a surface 14a and a surface 14b opposite to the surface 14a. The substrate 14 may include one or more conductive pads 16 (such as the conductive pads 16a and 16b) in proximity to, adjacent to, or embedded in and exposed at the surface 14a of the substrate 14. In some embodiments, a width of the conductive pads 16 is about 2 micrometers (μm) to about 20 μm. The substrate 14 may include a solder resist (not shown) on the surface 14a of the substrate 14 to fully expose or to expose at least a portion of the conductive pads 16 for electrical connections.

The electrical component 10 is disposed on the surface 14a of the substrate 14 through an adhesive layer or a glue layer 11. The electronic component 10 may include, for example, a chip or a die including a semiconductor substrate. The electronic component 10 may include one or more integrated circuit devices and one or more overlying interconnection structures. The integrated circuit devices may include active devices such as transistors and/or passive devices such as resistors, capacitors, inductors, or a combination thereof. The electronic component 10 has an active surface 10a facing away from the substrate 14, a back surface 10b opposite to the active surface 10a, and a lateral surface 10c between the active surface 10a and the back surface 10b. In some embodiments, a thickness of the electronic component 10 is about 10 μm to about 100 μm.

The electrical contacts 21 (such as the electrical contacts 21a and 21b) are disposed or arranged on the active surface 10a of the electronic component 10. The electrical contacts 21 may be or may include gold (Au), silver (Ag), copper (Cu), platinum (Pt), aluminum (Al), another metal, a solder alloy, or a combination of two or more thereof. In some embodiments, the electrical contacts 21 may include a bonding pad served as an external terminal of the electronic component 10 and a bump disposed on the pad. In some embodiments, alternatively, as shown in FIGS. 1C and 1D, the electrical contact 21 may be a stud bump 22 or a solder ball 23. In some embodiments, the stud bump 22 is formed by wire bonding processes with extruded wire tips. In some embodiments, the solder ball 23 includes a C4 bump, a BGA or an LGA. The electrical contacts 21 may be provided on any specific location over the active surface 10a of the electronic component 10 depending on the design specifications. In some embodiments, there may be any number of electrical contacts 21 on the electronic component 10 depending on design specifications. In some embodiments, a width of the electrical contacts 21 is about 2 μm to about 20 μm.

The electrical contacts 15 are disposed or arranged on the surface 14b of the substrate 14 and can provide electrical connections between the semiconductor device package 1 and external components (e.g. external circuits or circuit boards). The electrical contacts 15 (e.g. solder balls) may include a C4 bump, a BGA or an LGA. In some embodiments, the electrical contacts 15 can be used for a fan-in structure, a fan-out structure, or a combination of the fan-in and fan-out structure. In some embodiments, there may be any number of electrical contacts 15 on the substrate 14 depending on design specifications.

As shown in FIG. 1A, each of the conductive pads 16 is electrically connected to the corresponding electrical contacts 21 through the seed layers 19 and the metal layers 20.

Each of the seed layers 19 (such as the seed layers 19a and 19b) may include, for example, titanium (Ti), Cu, nickel (Ni), another metal, or an alloy (such as a titanium-tungsten alloy (TiW)).

Each of the metal layers 20 (such as the metal layers 20a and 20b) may include, for example, Au, Ag, Cu, Ni, palladium (Pd), another metal, a solder alloy, or a combination of two or more thereof. In some embodiments, a thickness of the metal layers 20 is about 2 µm to about 5 µm.

Each of the seed layers 19 are isolated, insulated or separated from another one by the isolation layers 17. Each of the metal layers 20 are isolated, insulated or separated from another one by the isolation layers 17.

Each of the isolation layers 17 (such as the isolation layers 17a and 17b) may include, for example, one or more organic materials (e.g., phosphoric anhydride (PA), a polyimide (PI), a polybenzoxazole (PBO), an epoxy, and an epoxy-based material), or one or more inorganic materials (e.g., silicon, a glass, a ceramic, and an oxide (such as a silicon oxide ($SiO_x$), a silicon nitride ($SiN_x$), and a tantalum oxide ($TaO_x$))). In some embodiments, a thickness of the isolation layers 17 is about 2 µm to about 5 µm. In some embodiments, a total thickness of one isolation layer, one metal layer, and one seed layer is about 4 µm to about 10 µm.

For example, the seed layer 19b are isolated, insulated or separated from the seed layer 19a and the metal layer 20a by the isolation layer 17b. The metal layer 20b are isolated, insulated or separated from the seed layer 19a and the metal layer 20a by the isolation layer 17b.

To be more specific, as shown in FIG. 1A, the isolation layer 17a is disposed on and in contact with a portion of the active surface 10a and the lateral surface 10c of the electrical component 10 and a portion of the surface 14a of the substrate 14. The seed layer 19a is disposed on the isolation layer 17a. In some embodiments, the seed layer 19a is conformally disposed on the isolation layer 17a. The seed layer 19a is also disposed on and in contact with the electrical contact 21a and the conductive pad 16a to provide an electrical connection therebetween. In some embodiments, the seed layer 19a and the isolation layer 17a may fully cover the electrical contact 21a. In some embodiments, the seed layer 19a and the isolation layer 17a may fully cover the conductive pad 16a. The metal layer 20a is disposed on the seed layer 19a. In some embodiments, the metal layer 20a is conformally disposed on the seed layer 19a. The metal layer 20a electrically connects the electrical contact 21a with the conductive pad 16a.

The isolation layer 17b is disposed on a portion of the active surface 10a of the electrical component 10, the metal layer 20a and a portion of the surface 14a of the substrate 14. In some embodiments, the isolation layer 17b is spaced apart from the isolation layer 17a. The isolation layer 17b is arranged to separate or isolate the electrical contact 21a from the electrical contact 21b. The isolation layer 17b is arranged to separate or isolate the conductive pad 16a from the conductive pad 16b. The isolation layer 17b is arranged to separate or isolate the metal layer 20a and the seed layer 19a from the metal layer 20b and the seed layer 19b. The seed layer 19b is disposed on the isolation layer 17b. In some embodiments, the seed layer 19b is conformally disposed on the isolation layer 17b. The seed layer 19b is also disposed on and in contact with the electrical contact 21b and the conductive pad 16b to provide an electrical connection therebetween. In some embodiments, the seed layer 19b and the isolation layer 17b may fully cover the electrical contact 21b. In some embodiments, the seed layer 19b and the isolation layer 17b may fully cover the conductive pad 16b. The metal layer 20b is disposed on the seed layer 19b. In some embodiments, the metal layer 20b is conformally disposed on the seed layer 19b. The metal layer 20b electrically connects the electrical contact 21b with the conductive pad 16b.

In some embodiments, the seed layers 19 and the metal layers 20 provide a fine-pitch connection (e.g., the line space (L/S) equal to or less than 2 µm/2 µm). For example, the seed layers 19 and the metal layers 20 can be connected to a fine-pitch conductive pad 16 and a fine-pitch electrical contact 21.

Although FIG. 1A shows that there are five metal layers 20 and five seed layers 19 in the semiconductor device package 1 to provide electrical connections between the conductive pads 16 and electrical contacts 21, the present disclosure is not limited thereto. In some embodiments, there may be any number of seed layers 19 depending on product specifications. In some embodiments, there may be any number of metal layers 20 depending on product specifications. In some embodiments, there may be any number of isolation layers 17 depending on product specifications.

The encapsulating layer 18 is disposed on the surface 14a of the substrate 14 to cover or encapsulate the electronic component 10, the conductive pads 16 on the surface 14a, the electrical contacts 21 on the active surface 10a, the metal layers 20 and the seed layers 19. The encapsulating layer 18 may include, for example, an epoxy resin having fillers, a molding compound (e.g., an epoxy molding compound or other molding compounds), a PI, a phenolic compound or material, a material with a silicone dispersed therein, or a combination thereof.

Figure 1B:
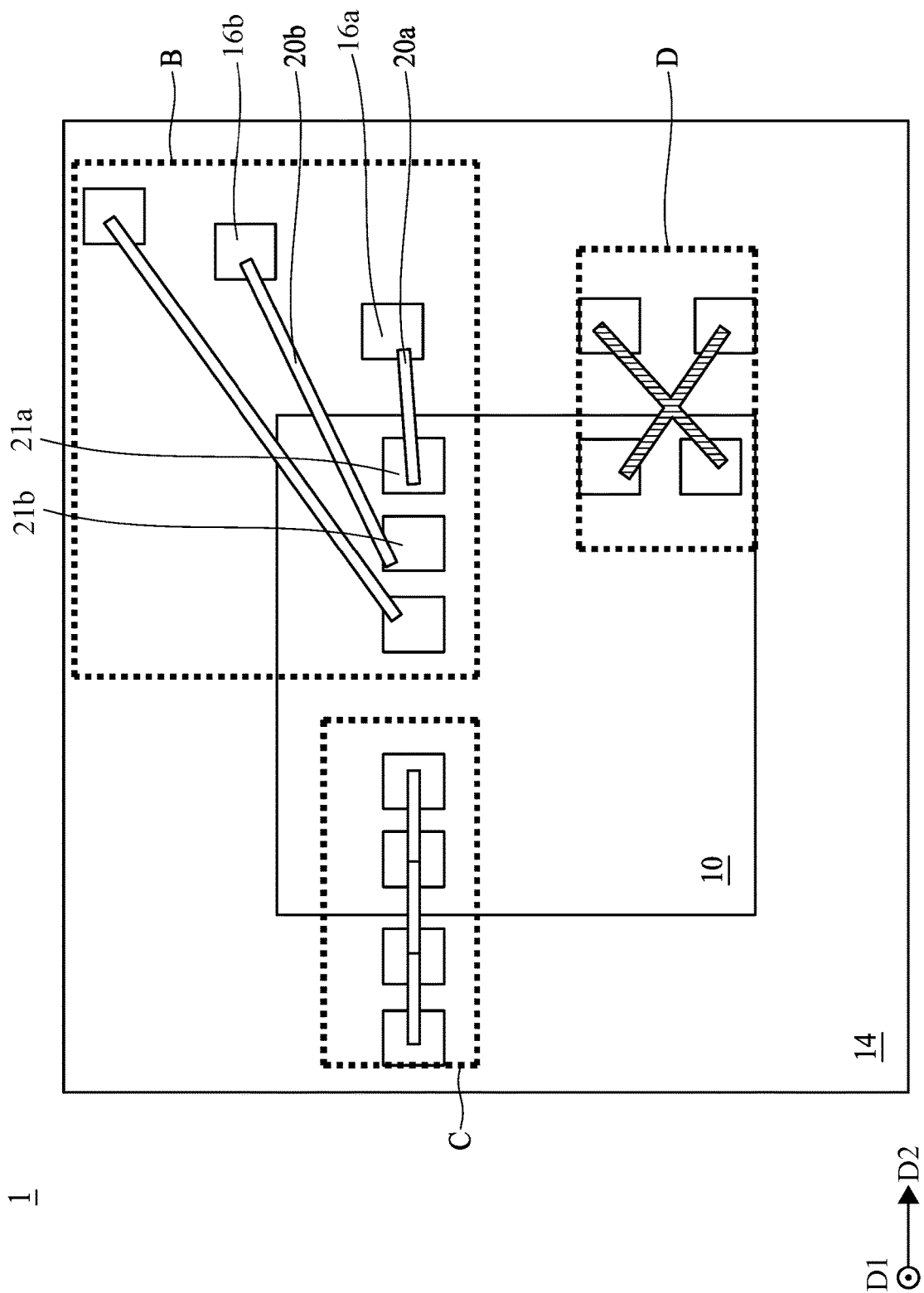
FIG. 1B illustrates a top view of a semiconductor device package in accordance with some embodiments of the present disclosure.
Figure 1C:
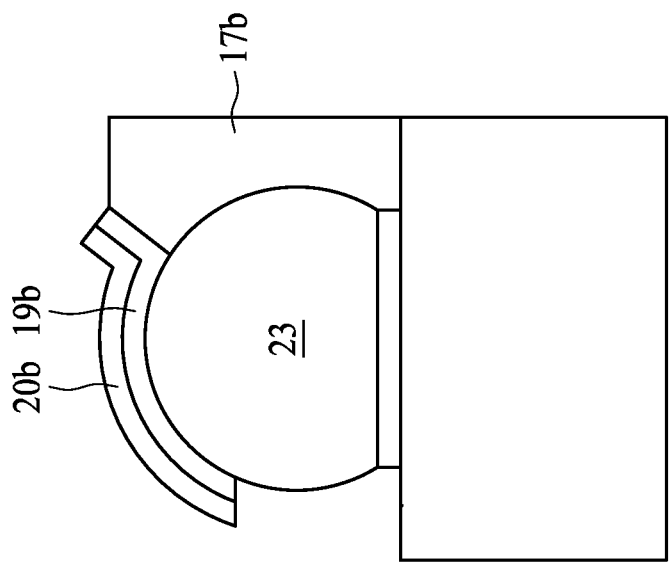
FIG. 1C illustrates an enlarged view of a portion in a dotted box A as shown in FIG. 1A in accordance with some embodiments of the present disclosure.
Figure 1D:
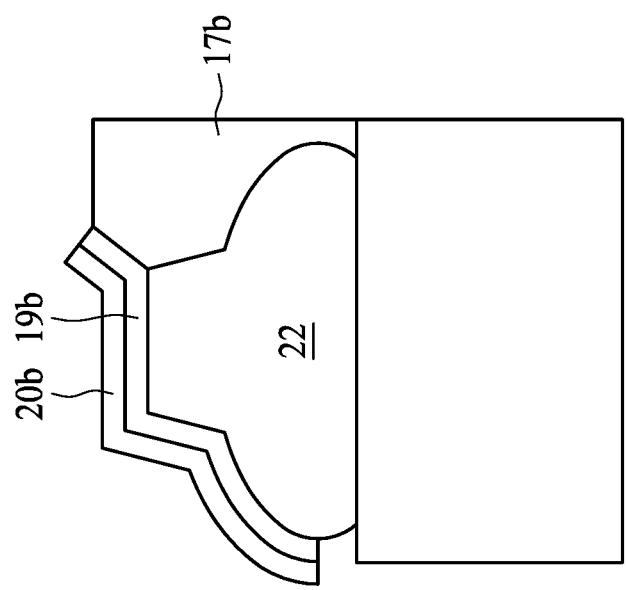
FIG. 1D illustrates an enlarged view of a portion in a dotted box A as shown in FIG. 1A in accordance with some embodiments of the present disclosure.

Referring to FIG. 1B, FIG. 1B illustrates a top view of the semiconductor device package 1. The substrate 14, the conductive pads 16, the electronic component 10, the electrical contacts 21, and the metal layers 20 are selectively illustrated in FIG. 1B for clarity of illustration. Each of the seed layers are under and blocked by the corresponding metal layers 20.

Although the metal layers 20 are illustrated as on the same plane in FIG. 1A, the positional relationships thereof from a top view may include several different kinds of embodiments. The metal layers 20, along with the underlying seed layers, may be designed to have one or more types of arrangements or positional relationships.

For example, in some embodiments, the metal layers 20 may be spaced apart from each other from a top view. In other words, the metal layers 20 may not overlap with each other along the direction D1. For example, as indicated by a dotted box B, the metal layer 20a and the metal layer 20b are spaced apart from each other.

In some embodiments, the metal layers 20 may be vertically corresponding to or aligned with each other. In other words, the metal layers 20 may overlap with each other along the direction D1. For example, as indicated by a dotted box C, the metal layers are overlapped.

In some embodiments, two of the metal layers 20 may be arranged to cross each other. In other words, two layers of the metal layers 20 may partially overlap with each other along the direction D1. For example, as indicated by a dotted box D, the metal layers cross each other. The metal layers intersect to form a cross.

In some embodiments, since the metal layers 20, along with the seed layers, may be designed to have one or more types of positional relationships as illustrated in FIG. 1B, the electrical contacts 21 located on any specific position of the electronic component 10 may be electrically connected to the conductive pads 16 located on any specific position of the substrate 14 as specified, and thus, the I/O bonding of the semiconductor device package 1 is flexible.

Figure 2A:
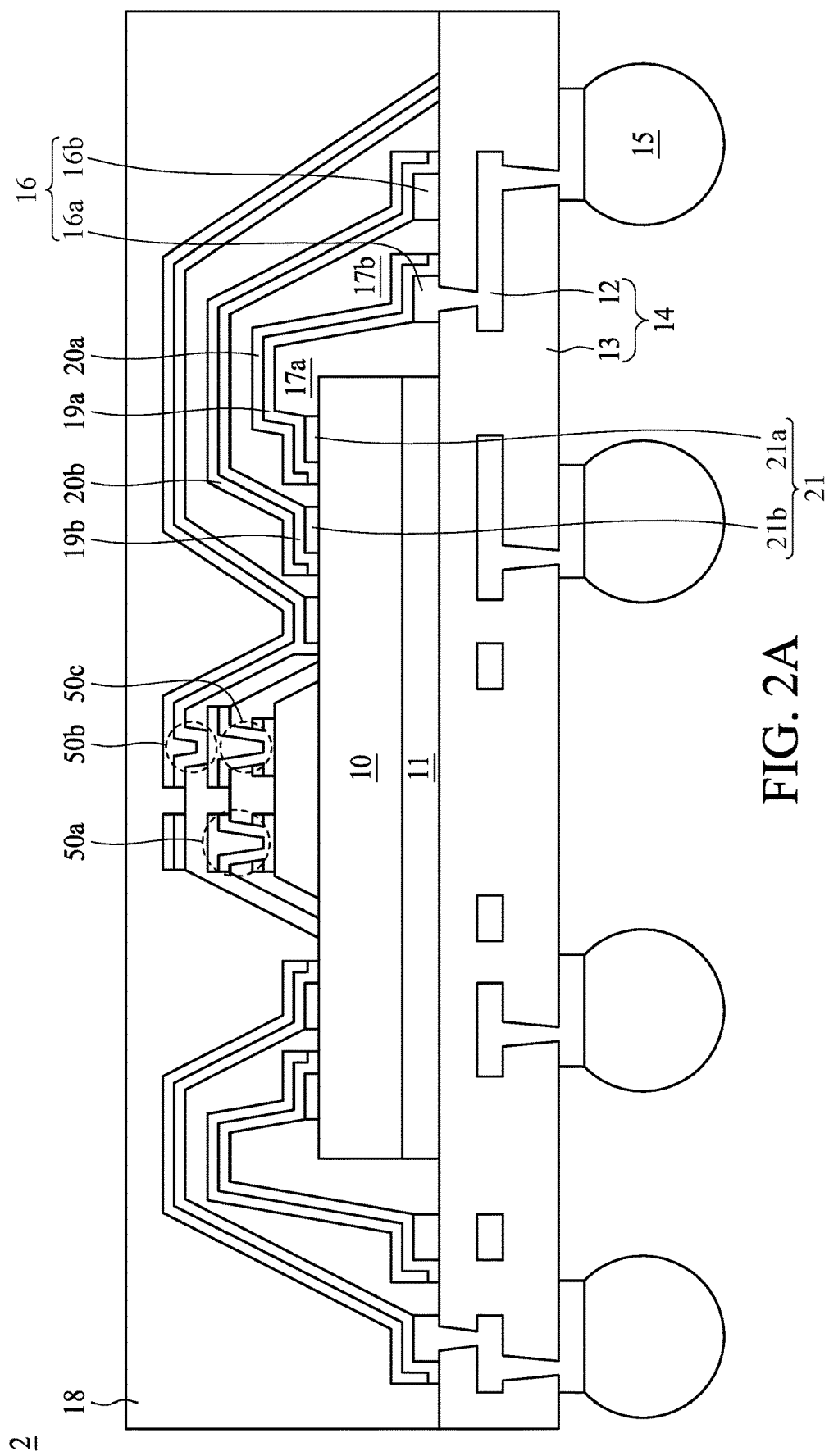
FIG. 2A illustrates a cross-sectional view of a semiconductor device package in accordance with some embodiments of the present disclosure.

FIG. 2A illustrates a cross-sectional view of a semiconductor device package 2 in accordance with some embodiments of the present disclosure. The semiconductor device package 2 is similar to the semiconductor device package 1 in FIG. 1A except that the semiconductor device package 2 includes conductive vias 50a, 50b, and 50c over the active surface 10a of the electronic component 10. The conductive vias 50a, 50b, and 50c may include materials as listed above with respect to the metal layers 20 and seed layers 19. In some embodiments, the conductive vias 50a, 50b, and 50c may be formed in the same operations as the metal layers 20 and seed layers 19. As shown in FIG. 2A, the conductive vias 50a, 50b, and 50c electrically connect the electronic component 10 to the metal layers and seed layers. In some embodiments, the conductive vias 50a, 50b, and 50c, the metal layers, and the seed layers may serve as redistribution layers (RDLs) for the electronic component 10. In some embodiments, there may be any number of vias connected to the metal layers and seed layers over the active surface 10a of the electronic component 10.

Figure 2B:
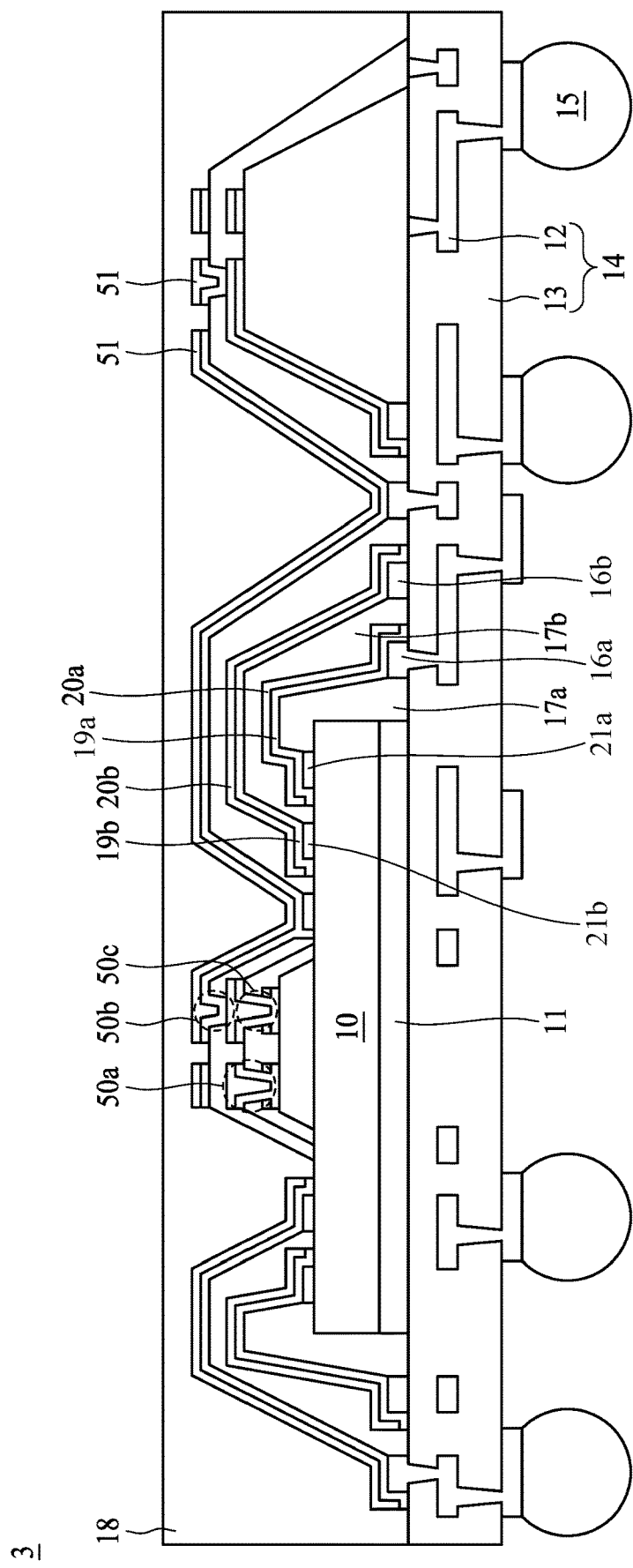
FIG. 2B illustrates a cross-sectional view of a semiconductor device package in accordance with some embodiments of the present disclosure.

FIG. 2B illustrates a cross-sectional view of a semiconductor device package 3 in accordance with some embodiments of the present disclosure. The semiconductor device package 3 is similar to the semiconductor device package 2 in FIG. 2A except that the semiconductor device package 3 further includes conductive vias 51 outside of the active surface 10a of the electronic component 10. The conductive vias 51 are over the top surface 14a of the substrate 14. The conductive vias 51 are electrically connected to the conductive pads through a metal layer and a seed layer. In some embodiments, there may be any number of vias connected to the conductive pads over the top surface 14a of the substrate 14.

Figure 2C:
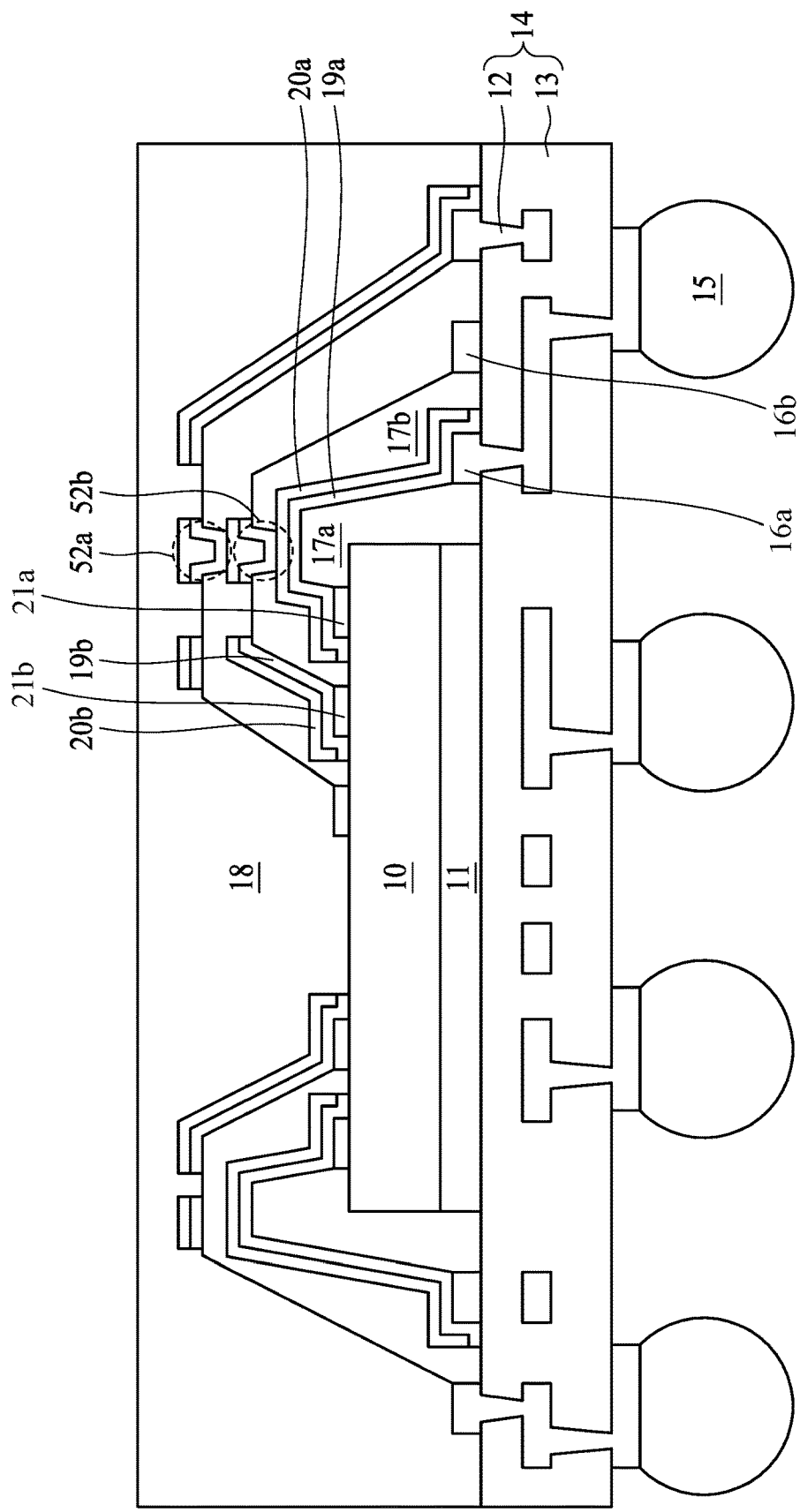
FIG. 2C illustrates a cross-sectional view of a semiconductor device package in accordance with some embodiments of the present disclosure.

FIG. 2C illustrates a cross-sectional view of a semiconductor device package 4 in accordance with some embodiments of the present disclosure. The semiconductor device package 4 is similar to the semiconductor device package 1 in FIG. 1A, one of the differences is that some metal layers (such as the metal layer 20b) of the semiconductor device package 4 are discontinuous or sectional. Another one of the differences is that the metal layer 20a is electrically connected to a section of the metal layer 20b. The semiconductor device package 4 includes conductive vias 52a and 52b penetrating or passing through the isolation layer 17b. The conductive vias 52a and 52b electrically connect the metal layer 20a to the discontinuous metal layer 20b. In some embodiments, there may be any number of vias electrically connecting the metal layers to each other.

In some embodiments, the semiconductor device packages 2, 3, and 4 may include an antenna pattern over the substrate 14 and/or the electronic component 10. The conductive vias thereof may be used to electrically connect to the antenna pattern.

In some embodiments, the metal layers 20 and seed layers 19 may be formed to serve as a shielding layer to provide electromagnetic interference (EMI) protection for the electronic component 10. The shielding layer may be disposed on an external surface of the encapsulating layer 18 and covers the encapsulating layer 18, the electrical components 10, and the lateral surfaces of the substrate 14. The shielding layer may be electrically connected to a grounding element. In some embodiments, the shielding layer may include a conductive thin film, and may include, for example, Al, Cu, chromium (Cr), tin (Sn), Au, Ag, Ni or stainless steel, or a mixture, an alloy, or other combination thereof.

Figure 3:
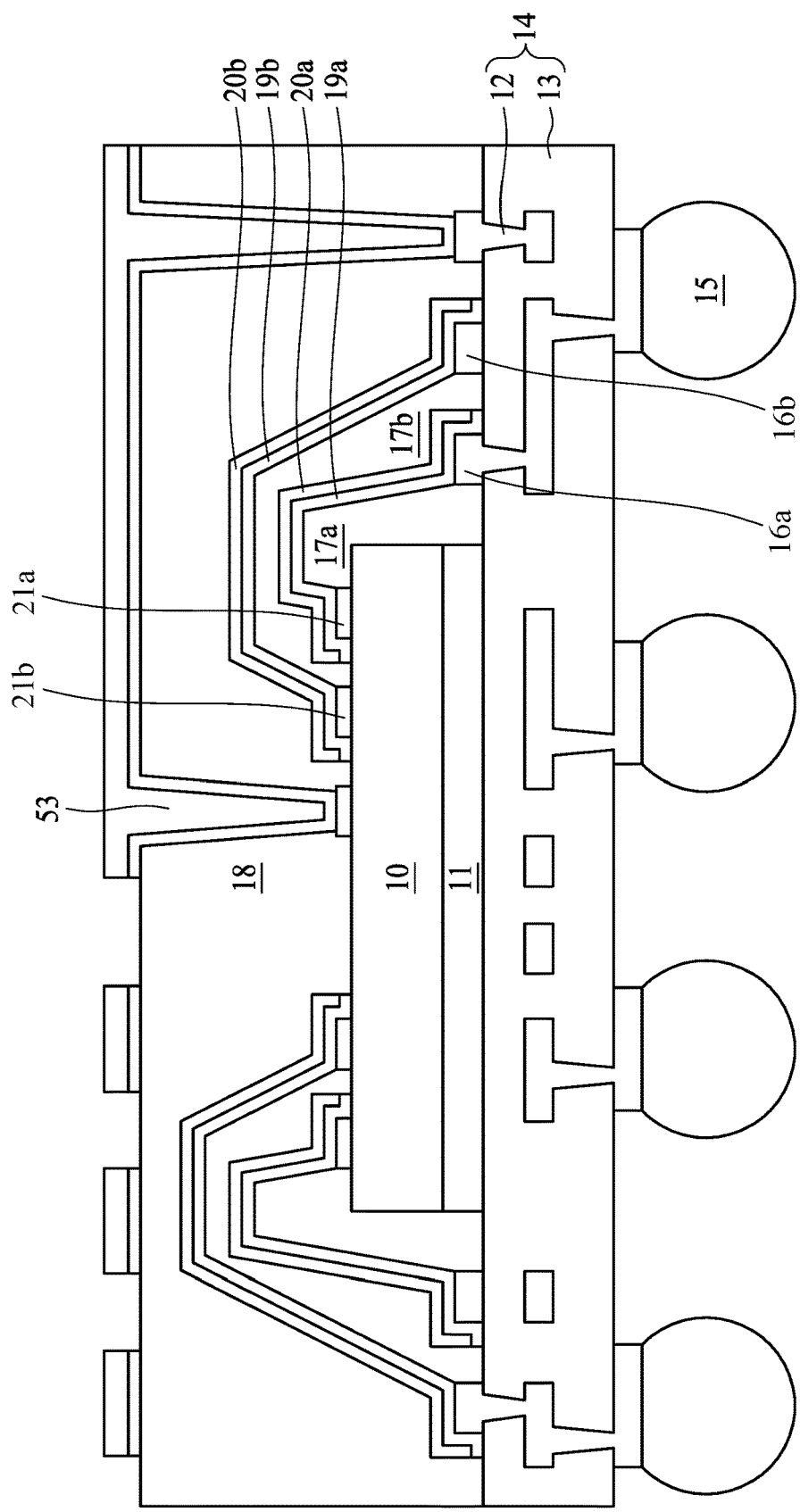
FIG. 3 illustrates a cross-sectional view of a semiconductor device package in accordance with some embodiments of the present disclosure.

FIG. 3 illustrates a cross-sectional view of a semiconductor device package 5 in accordance with some embodiments of the present disclosure. The semiconductor device package 5 is similar to the semiconductor device package 1 in FIG. 1A except that the semiconductor device package 5 includes conductive vias 53 penetrating or passing through the encapsulating layer 18, and connecting to electrical contacts over the encapsulating layer 18. The electrical contacts may provide electrical connections between the semiconductor device package 5 and external components. In some embodiments, there may be any number of conductive vias 53 penetrating through the encapsulating layer 18 and electrically connecting the semiconductor device package 5 to external components.

Figure 4:
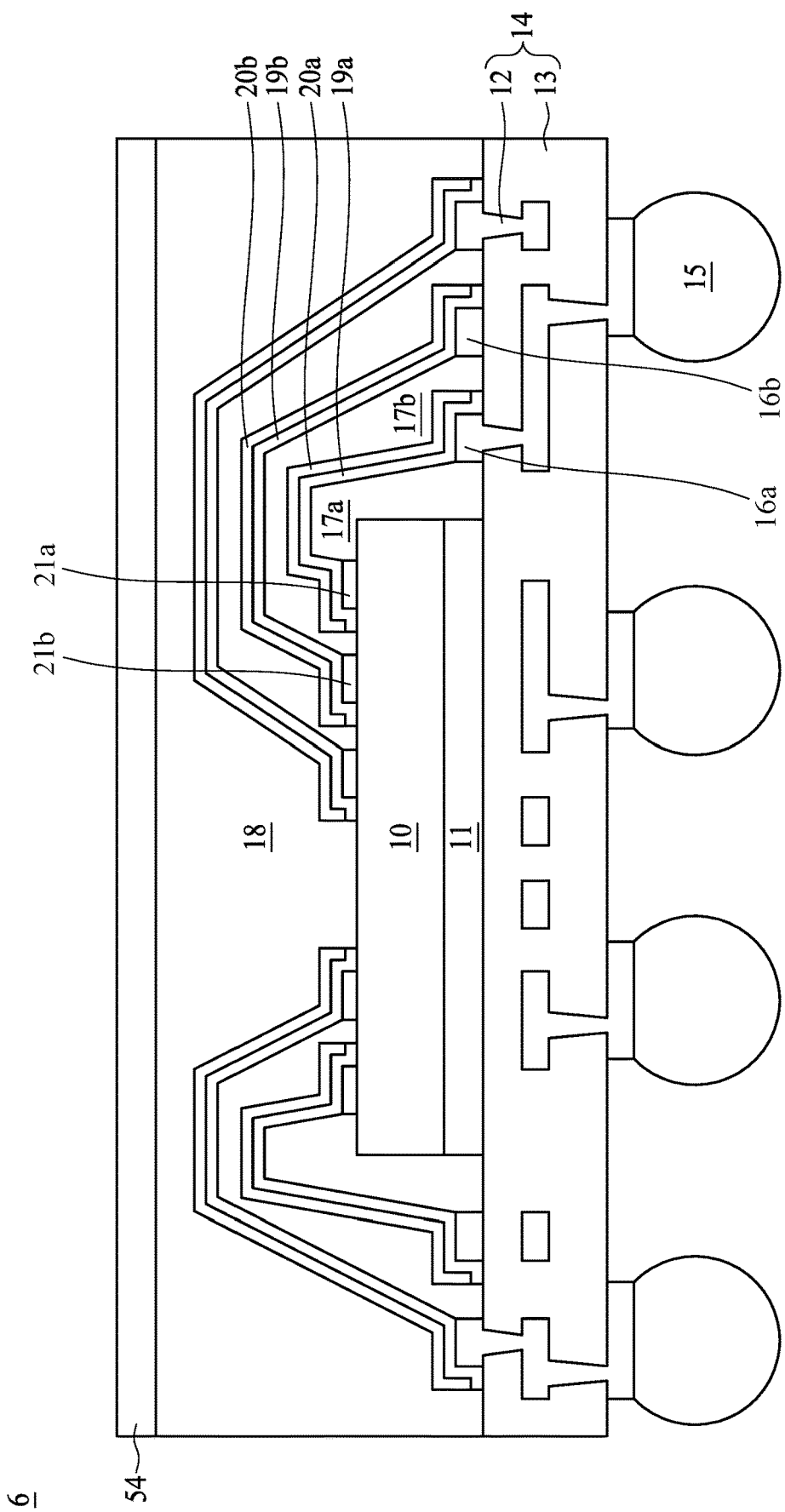
FIG. 4 illustrates a cross-sectional view of a semiconductor device package in accordance with some embodiments of the present disclosure.

FIG. 4 illustrates a cross-sectional view of a semiconductor device package 6 in accordance with some embodiments of the present disclosure. The semiconductor device package 6 is similar to the semiconductor device package 1 in FIG. 1A except that the semiconductor device package 6 includes a balancing film 54 over the encapsulating layer 18. The balancing film 54 may include materials as listed above with respect to the insulating layers 17. The balancing film 54 may balance or reduce the stress in the semiconductor device package 6, and prevent the semiconductor device package 6 from warpage or deformation.

Figure 5:
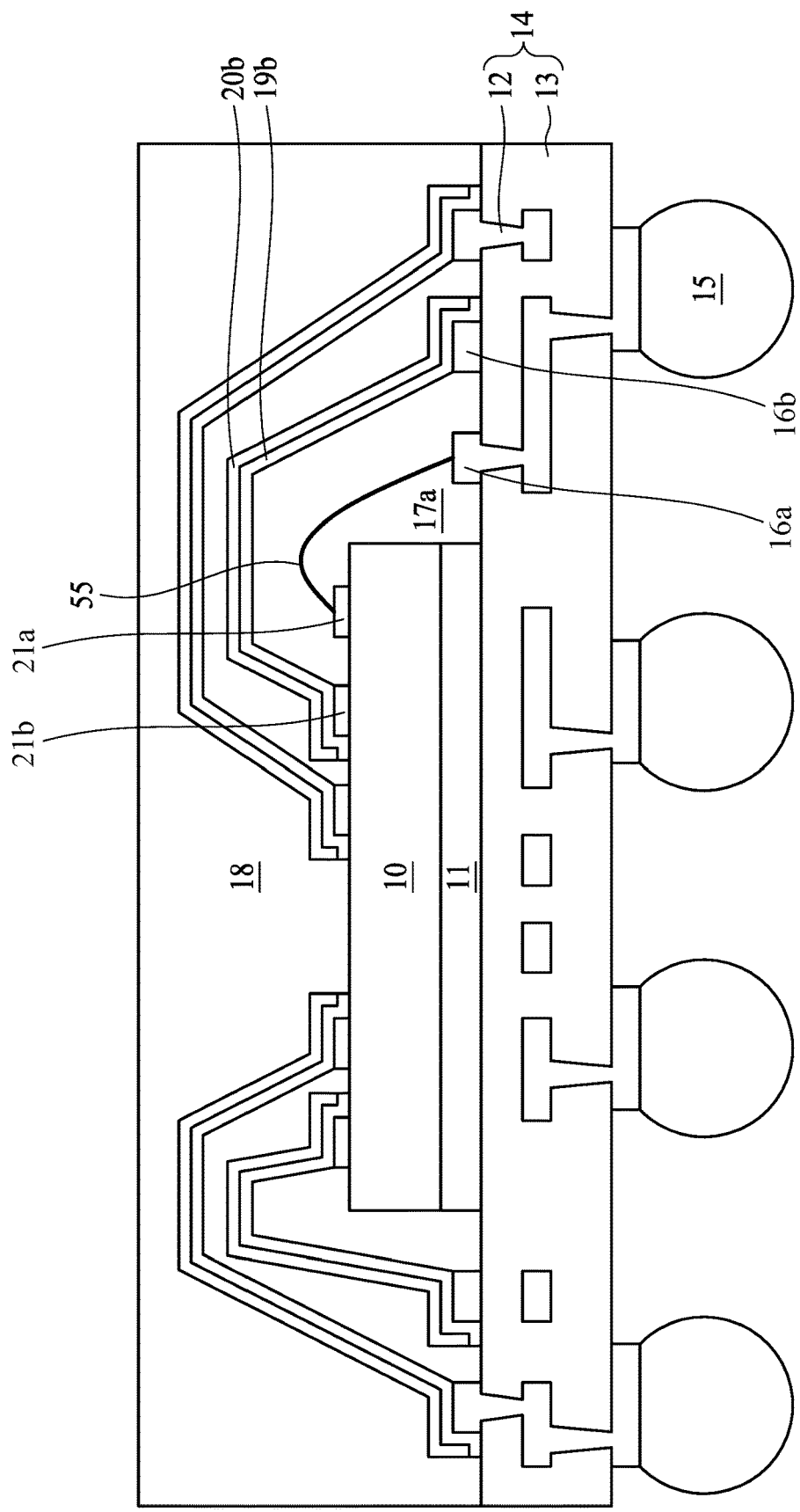
FIG. 5 illustrates a cross-sectional view of a semiconductor device package in accordance with some embodiments of the present disclosure.

FIG. 5 illustrates a cross-sectional view of a semiconductor device package 7 in accordance with some embodiments of the present disclosure. The semiconductor device package 7 is similar to the semiconductor device package 1 in FIG. 1A except that the semiconductor device package 7 includes a bonding wire 55 electrically connected the conductive pad 16a with the electrical contact 21a. The bonding wire 55 may be or may include, for example, Cu. The bonding wire 55 may be formed by a wire-bonding technique.

Figure 6A:
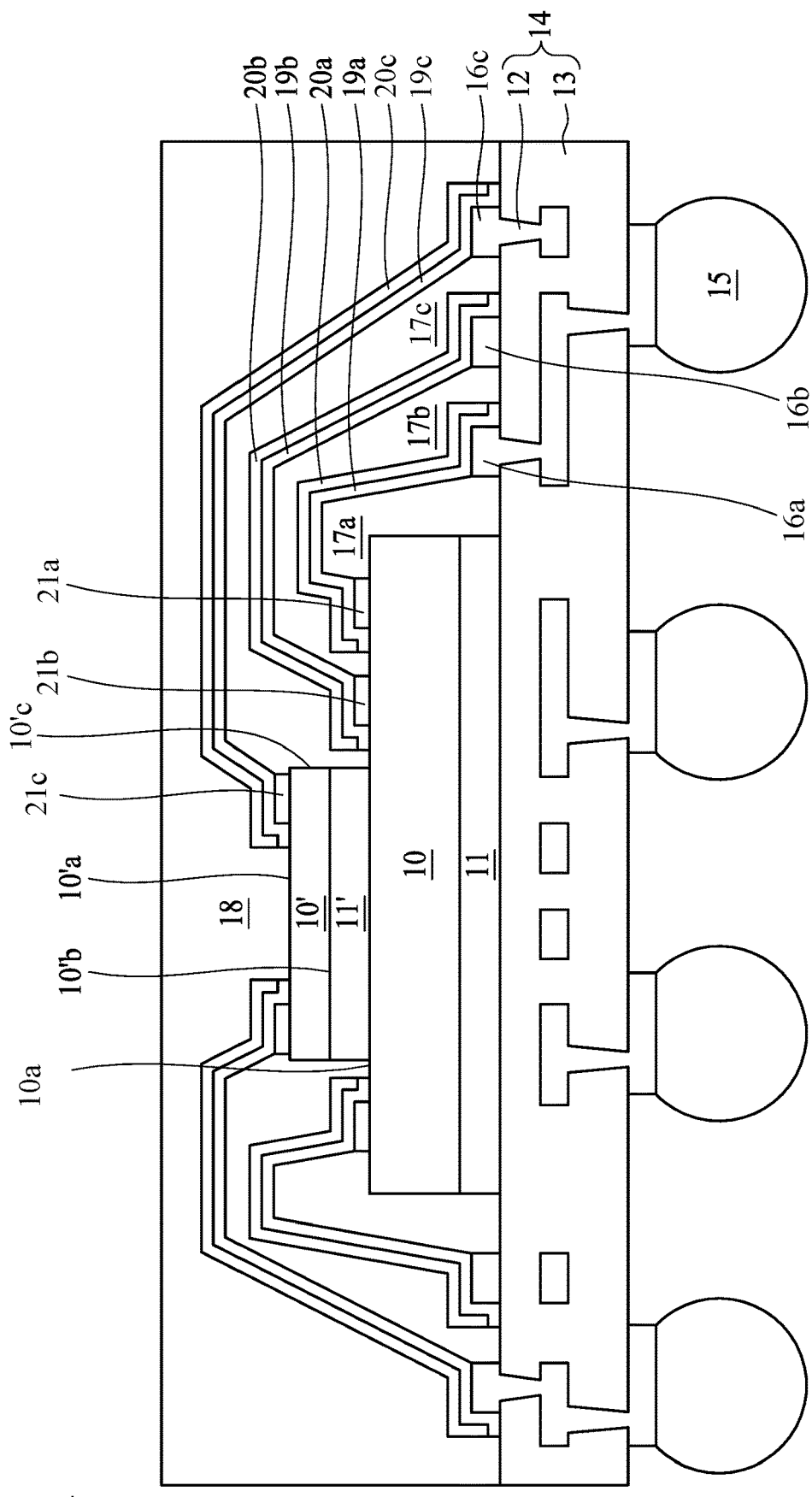
FIG. 6A illustrates a cross-sectional view of a semiconductor device package in accordance with some embodiments of the present disclosure.

FIG. 6A illustrates a cross-sectional view of a semiconductor device package 8 in accordance with some embodiments of the present disclosure. The semiconductor device package 8 is similar to the semiconductor device package 1 in FIG. 1A, with some differences described below.

The semiconductor device package 8 includes the electrical component 10 and another electrical component 10' disposed on the electrical component 10 through an adhesive layer 11'. The electronic component 10' has an active surface 10'a facing away from the electronic component 10, a back surface 10'b opposite to the active surface 10'a, and a lateral surface 10'c between the active surface 10'a and the back surface 10'b. Electrical contacts (such as the electrical contact 21c) are disposed on the active surface 10' of the electronic component 10'. In some embodiments, there may be any number of electronic components 10 and 10' on the substrate 14 depending on product specifications.

As shown in FIG. 1A, the isolation layer 17c is disposed on and in contact with a portion of the active surface 10'a and the lateral surface 10'c of the electrical component 10' and a portion of the active surface 10a of the electrical component 10. The seed layer 19c is disposed on the isolation layer 17c. In some embodiments, the seed layer 19c is conformally disposed on the isolation layer 17c. The seed layer 19c is also disposed on and in contact with the electrical contact 21c and the conductive pad 16c to provide an electrical connection therebetween. In some embodiments, the seed layer 19c and the isolation layer 17c may fully cover the electrical contact 21c. In some embodiments, the seed layer 19c and the isolation layer 17c may fully cover the conductive pad 16c. The metal layer 20c is disposed on the seed layer 19c. In some embodiments, the metal layer 20c is conformally disposed on the seed layer 19c. The metal layer 20c electrically connects the electrical contact 21c with the conductive pad 16c.

Figure 6B:
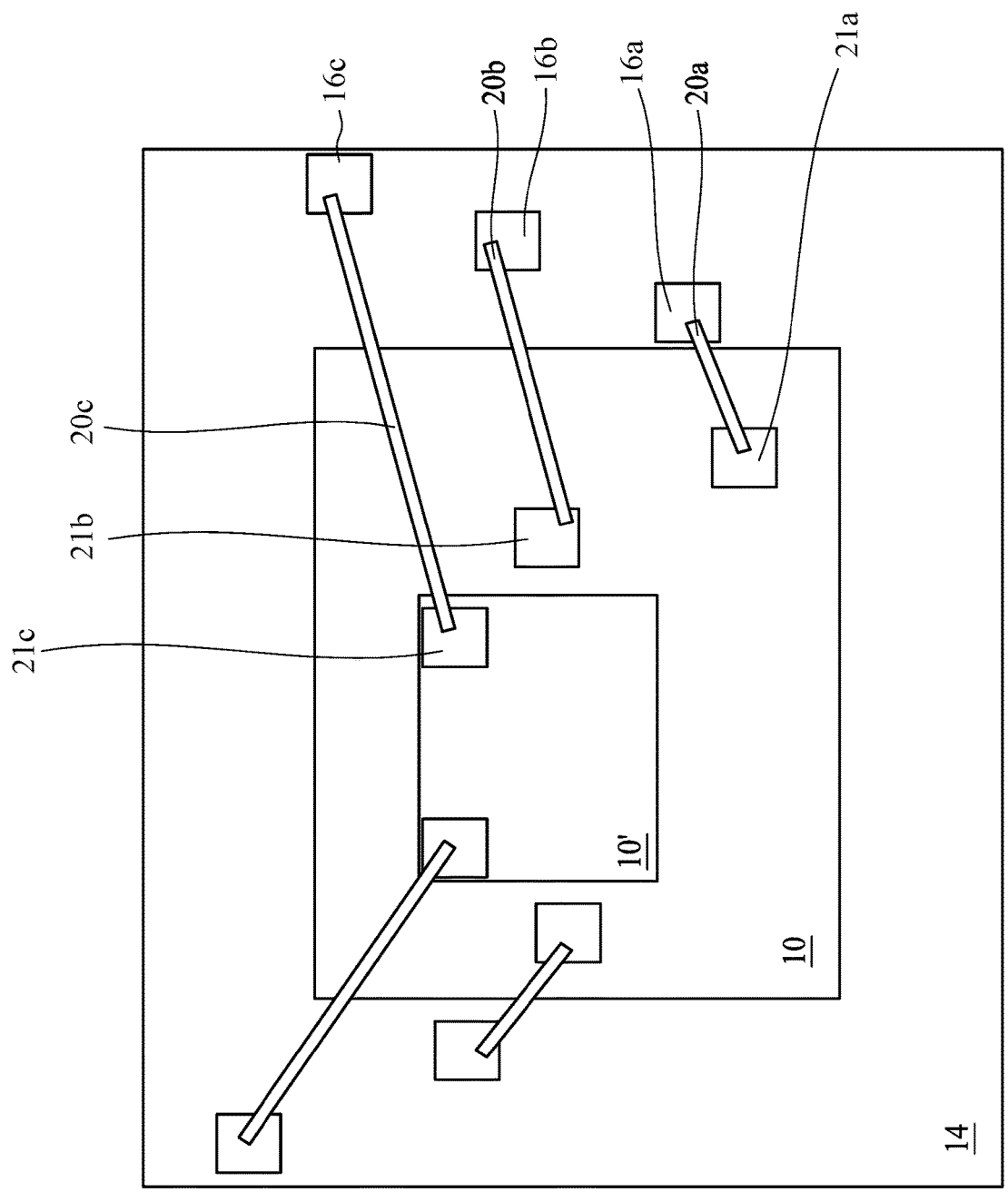
FIG. 6B illustrates a top view of a semiconductor device package in accordance with some embodiments of the present disclosure.

Referring to FIG. 6B, FIG. 6B illustrates a top view of the semiconductor device package 8. The substrate 14, the conductive pads 16, the electronic components 10 and 10', the electrical contacts 21, and the metal layers 20 are selectively illustrated in FIG. 6B for clarity of illustration.

As shown in FIG. 6B, the metal layer 20c connects the electrical contact 21c on the electronic component 10' to the conductive pad 16c on the substrate 14 without further connecting to the electrical contacts 21a and 21b on the electronic component 10. The electrical connections between the substrate 14 and the electronic component 10 and the electrical connections between the substrate 14 and the electronic component 10' are formed independently.

Figure 6C:
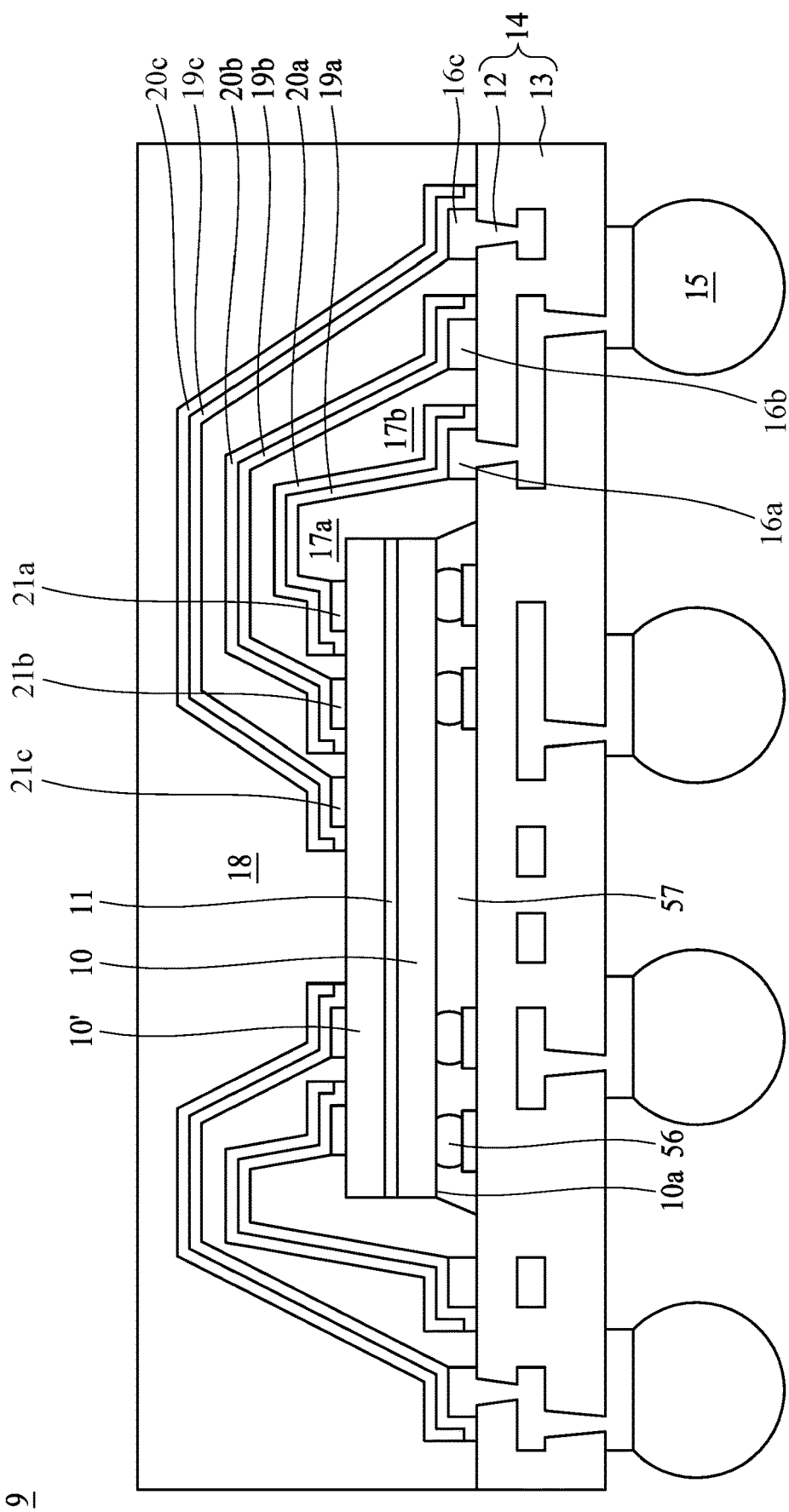
FIG. 6C illustrates a cross-sectional view of a semiconductor device package in accordance with some embodiments of the present disclosure.

FIG. 6C illustrates a cross-sectional view of a semiconductor device package 9 in accordance with some embodiments of the present disclosure. The semiconductor device package 9 is similar to the semiconductor device package 8 in FIG. 6A except that the electronic component 10 is disposed on the substrate 14 with the active surface 10a facing toward the substrate 14. The electronic component 10 and the electronic component 10' stacked with each other back-to-back through the adhesive layer 11.

As shown in FIG. 6C, the electronic component 10 is electrically connected to the substrate 14 through solder balls 56 with underfill 57 dispersed therebetween. In some embodiments, the underfill 57 may include, for example, an epoxy resin, a molding compound (e.g., an epoxy molding compound), a PI, a phenolic compound, a material including a silicone dispersed therein, or a combination thereof.

Figure 6D:
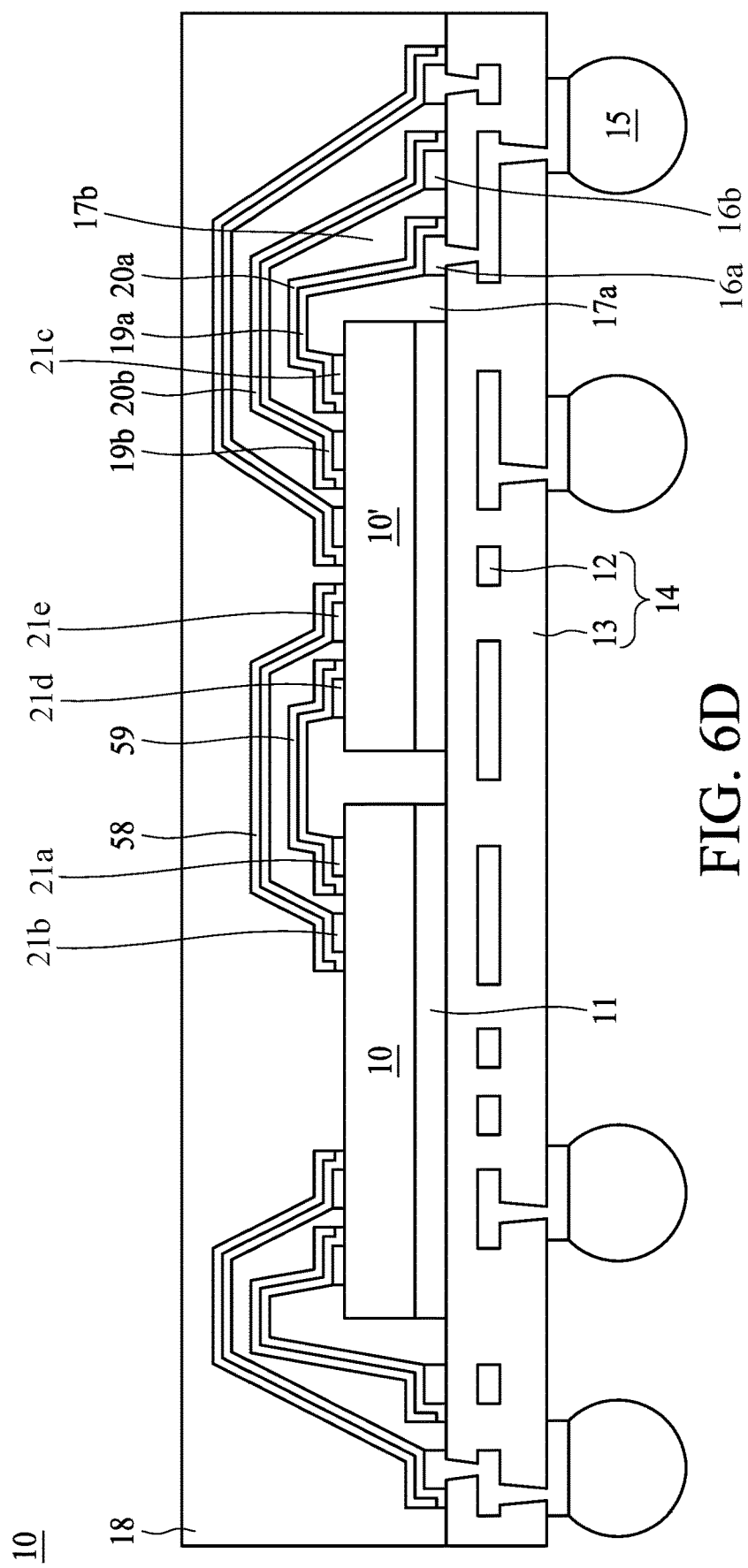
FIG. 6D illustrates a cross-sectional view of a semiconductor device package in accordance with some embodiments of the present disclosure.

FIG. 6D illustrates a cross-sectional view of a semiconductor device package 10 in accordance with some embodiments of the present disclosure. The semiconductor device package 10 is similar to the semiconductor device package 8 in FIG. 6A except that the electronic component 10' of the semiconductor device package 10 is disposed on the substrate 14, and is side-by-side with the electronic component 10. Metal layers 58 and 59 electrically connect the electrical contacts 21d and 21e on the electronic component 10' to the electrical contacts 21a and 21b on the electronic component 10.

FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L, FIG. 7M, FIG. 7N, and FIG. 7O, are cross-sectional views of a semiconductor device package at various stages of fabrication, in accordance with some embodiments of the present disclosure. At least some of these figures have been simplified for a better understanding of the aspects of the present disclosure.

Figure 7A:
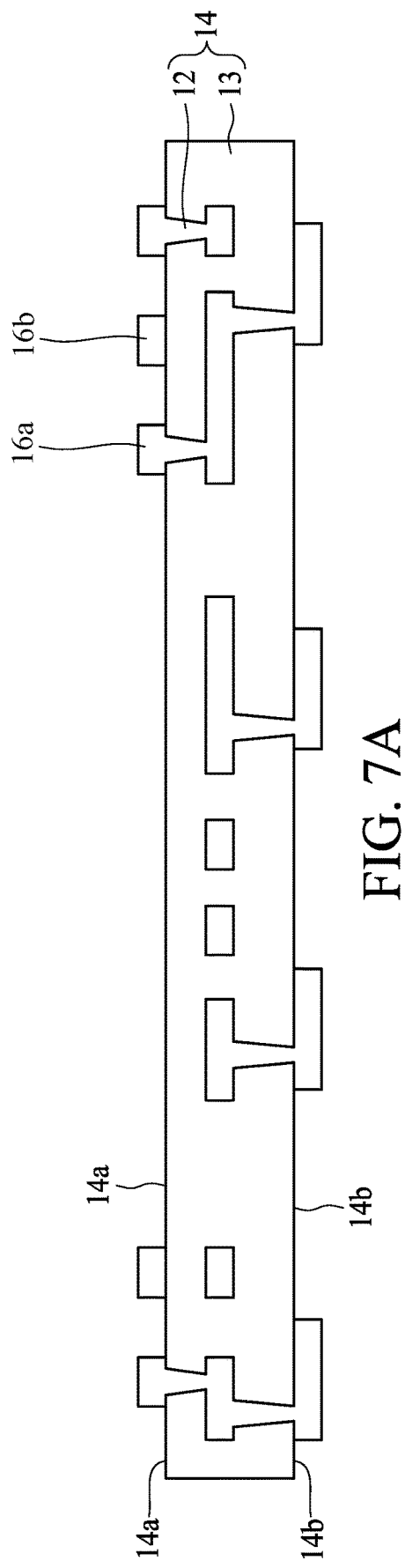
FIG. 7A illustrates one or more stages of a method of manufacturing a semiconductor device package in accordance with some embodiments of the present disclosure.

Referring to FIG. 7A, a substrate 14 is provided. The substrate 14 has a top surface 14a and a back surface 14b opposite to the top surface 14a. Conductive pads 16a and 16b are arranged or provided on the top surface 14a of the substrate 14.

Figure 7B:
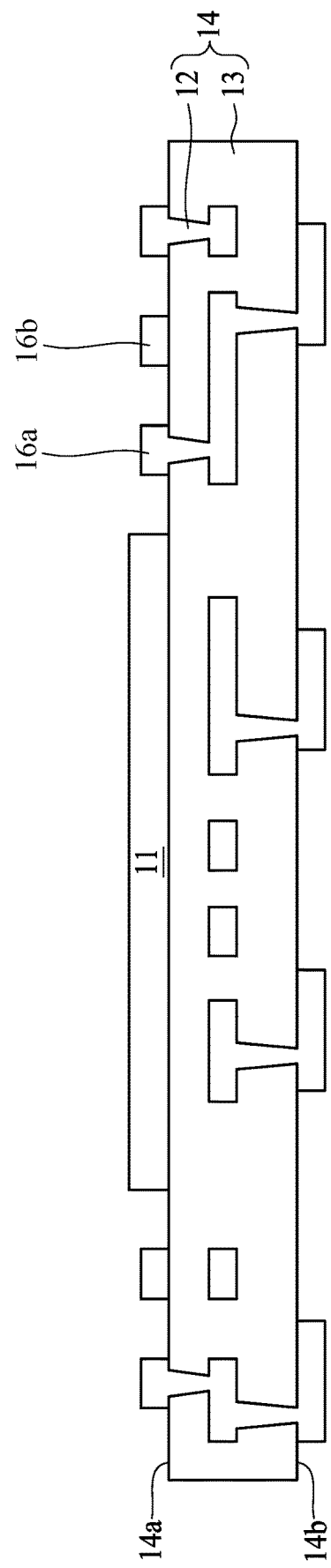
FIG. 7B illustrates one or more stages of a method of manufacturing a semiconductor device package in accordance with some embodiments of the present disclosure.

Referring to FIG. 7B, an adhesive layer 11 is applied on the substrate 14. In some embodiments, the adhesive layer 11 may include glue or other intermediate layers for die-attaching.

Figure 7C:
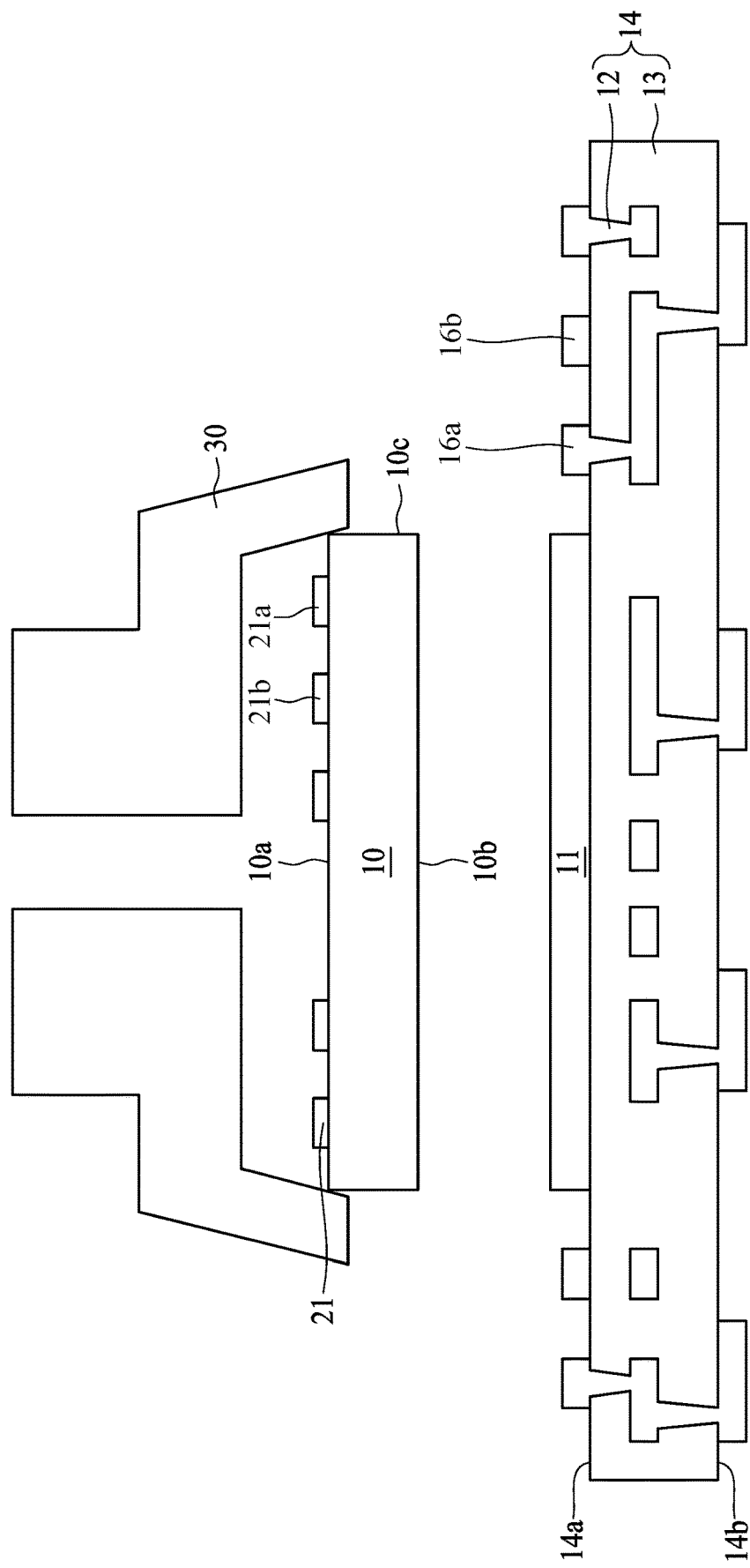
FIG. 7C illustrates one or more stages of a method of manufacturing a semiconductor device package in accordance with some embodiments of the present disclosure.

Referring to FIG. 7C, an electronic component 10 is disposed on the adhesive layer 11 by a capillary 30. In some embodiments, the electronic component 10 may be disposed on the adhesive layer 11 through other tools. The electronic component 10 has an active surface 10a facing away from the substrate 14, a back surface 10b opposite to the active surface 10a, and a lateral surface 10c between the active surface 10a and the back surface 10b. Electrical contacts 21a and 21b are arranged or provided on the active surface 10a of the electronic component 10.

Figure 7D:
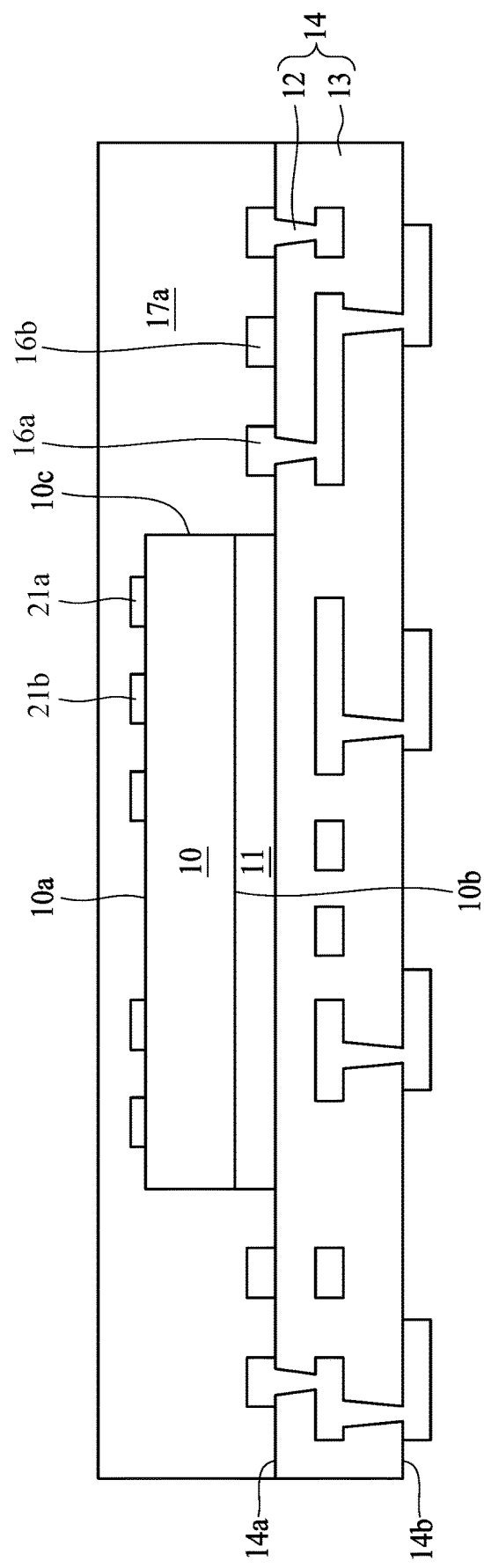
FIG. 7D illustrates one or more stages of a method of manufacturing a semiconductor device package in accordance with some embodiments of the present disclosure.

Referring to FIG. 7D, an isolation layer 17a is formed on the substrate 14 and the electronic component 10. In some embodiments, the isolation layer 17a may be formed by, for example, coating, lamination or other suitable processes. In some embodiments, the isolation layer 17a may be formed by a thermoforming process.

Figure 7E:
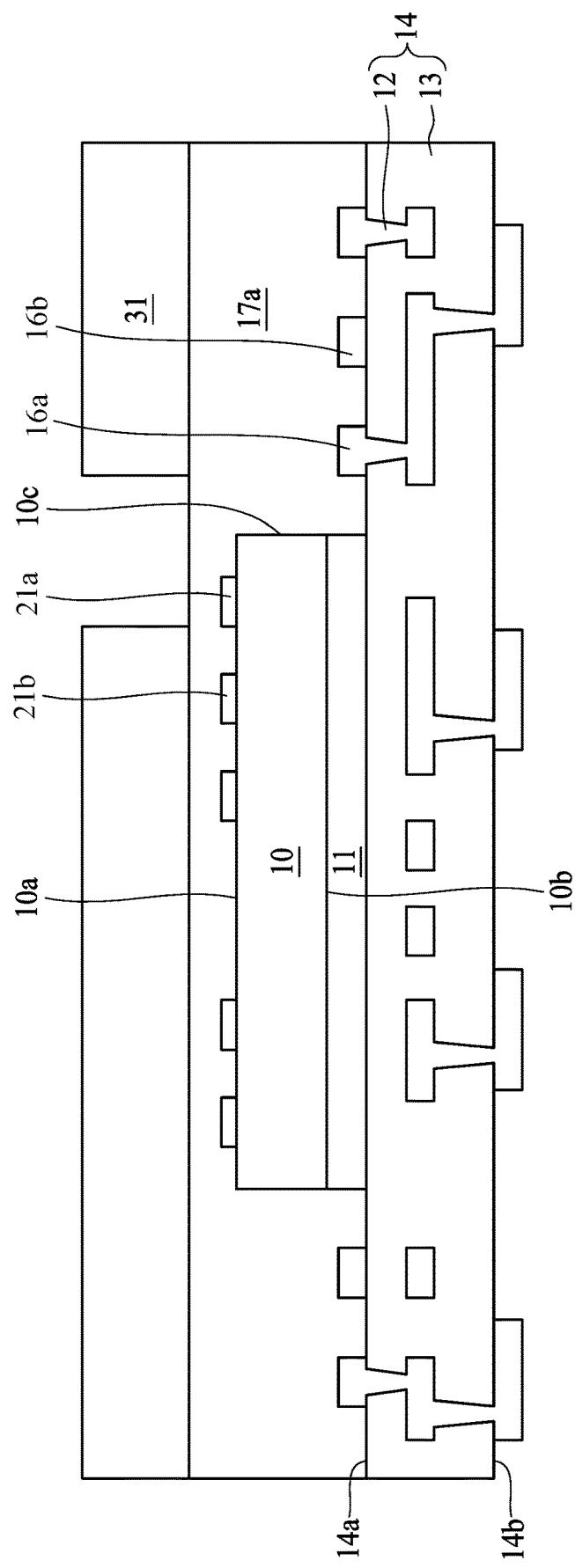
FIG. 7E illustrates one or more stages of a method of manufacturing a semiconductor device package in accordance with some embodiments of the present disclosure.

Referring to FIG. 7E, a photoresist film 31 (or a mask) is formed on the isolation layer 17a by, for example, coating. One or more openings are formed in the photoresist film 31 by, for example, lithographic technique, to expose a portion of the isolation layer 17a.

Figure 7F:
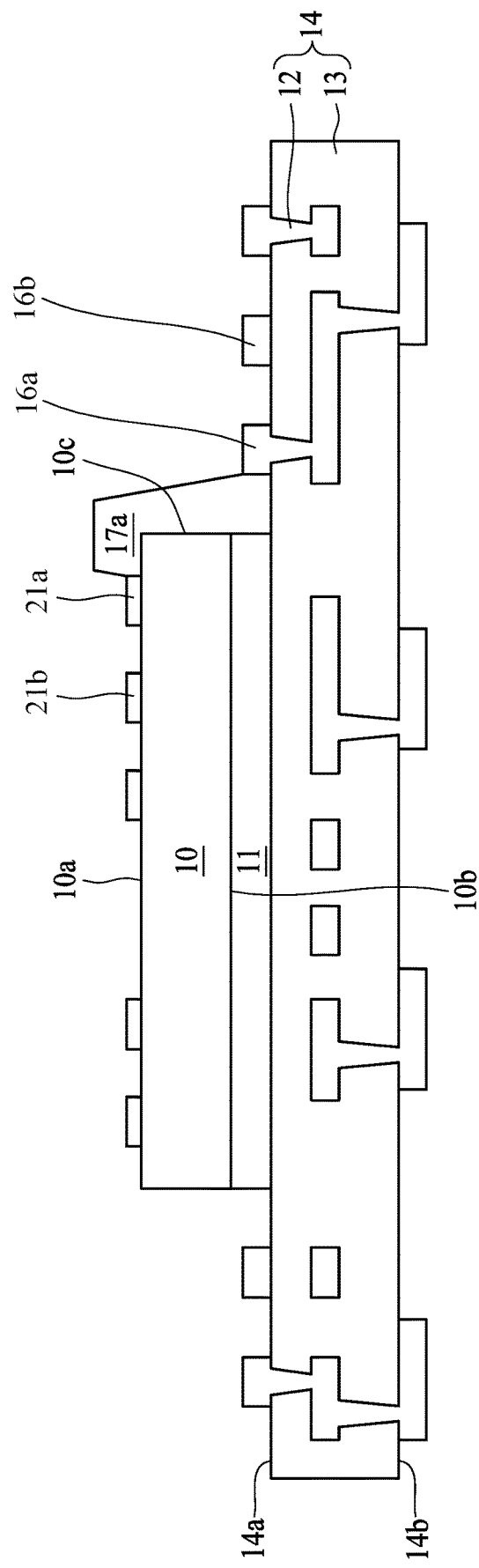
FIG. 7F illustrates one or more stages of a method of manufacturing a semiconductor device package in accordance with some embodiments of the present disclosure.

Referring to FIG. 7F, the photoresist film 31 and the covered portion of the isolation layer 17a are removed by etching or other suitable processes. The remaining isolation layer 17a covers or encapsulating a portion of the active surface 10a, the lateral surface 10c of the electronic component 10, and a portion of the surface 14a of the substrate 14.

Figure 7G:
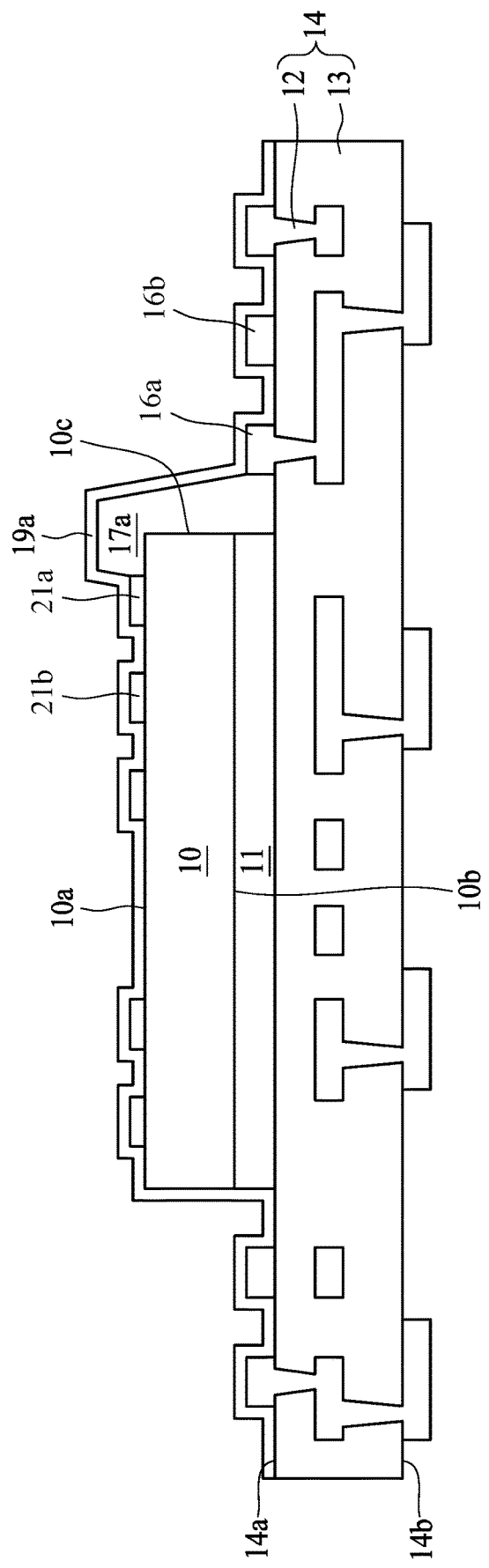
FIG. 7G illustrates one or more stages of a method of manufacturing a semiconductor device package in accordance with some embodiments of the present disclosure.

Referring to FIG. 7G, a seed layer 19a is disposed conformally on the remaining isolation layer 17a, the exposed top surface 14a, the exposed active surface 10a, the conductive pad 16a and the electrical contact 21a. In some embodiments, the seed layer 19a may be formed by sputtering titanium and copper (Ti/Cu) or a TiW. In some embodiments, the seed layer 19a may be formed by electroless plating Ni or Cu.

Figure 7H:
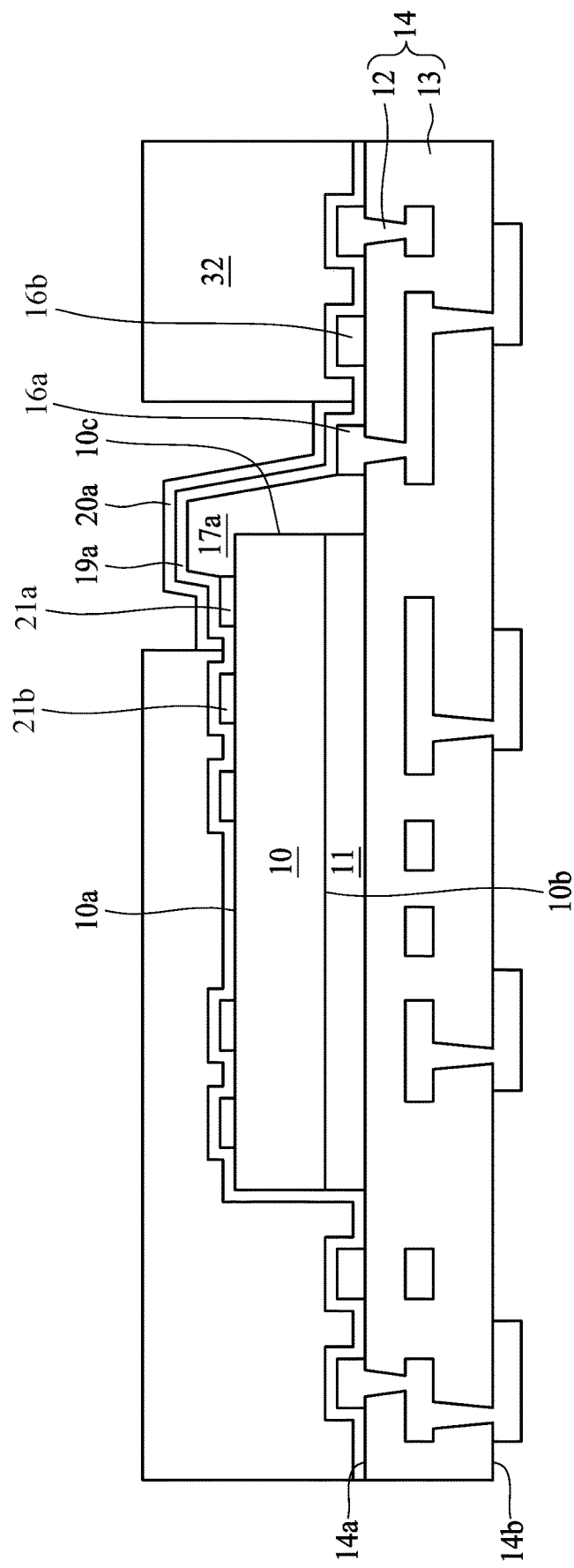
FIG. 7H illustrates one or more stages of a method of manufacturing a semiconductor device package in accordance with some embodiments of the present disclosure.

Referring to FIG. 7H, a photoresist film 32 is formed on the seed layer 19a by, for example, coating. An opening is formed in the photoresist film 32 to expose a portion of the seed layer 19a. Then, a metal layer 20a is disposed on the exposed seed layer 19a. In some embodiments, the metal layer 20a may be formed by plating Cu, Ag, Ni, Au, or another metal. In some embodiments, the metal layer 20a may be formed by electroless plating Cu, Ni, Pb, or another metal. In some embodiments, the metal layer 20a may be formed by printing Cu, Ag, Au, or another metal.

Figure 7I:
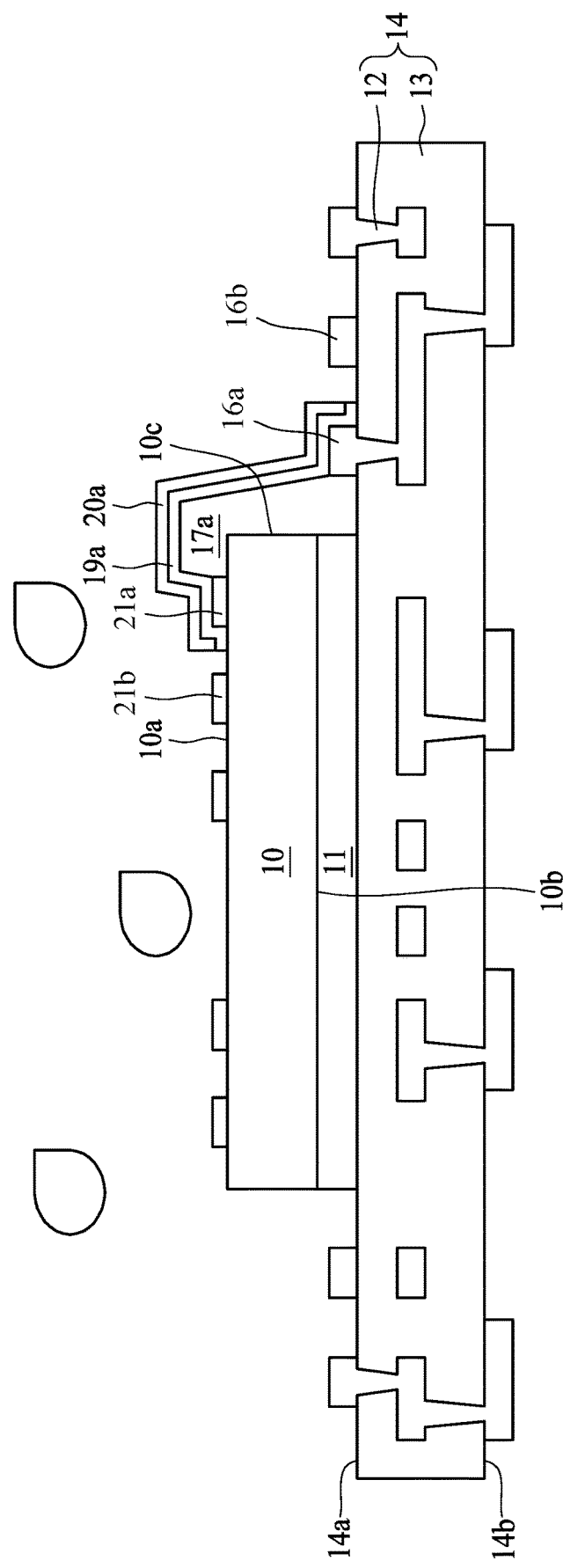
FIG. 7I illustrates one or more stages of a method of manufacturing a semiconductor device package in accordance with some embodiments of the present disclosure.

Referring to FIG. 7I, the photoresist film 32 and the covered portion of the seed layer 19a are removed by etching or other suitable processes.

As shown in FIG. 7I, the seed layer 19a and the metal layer 20a together form an electrical connection between the conductive pad 16a and the electrical contact 21a.

Figure 7J:
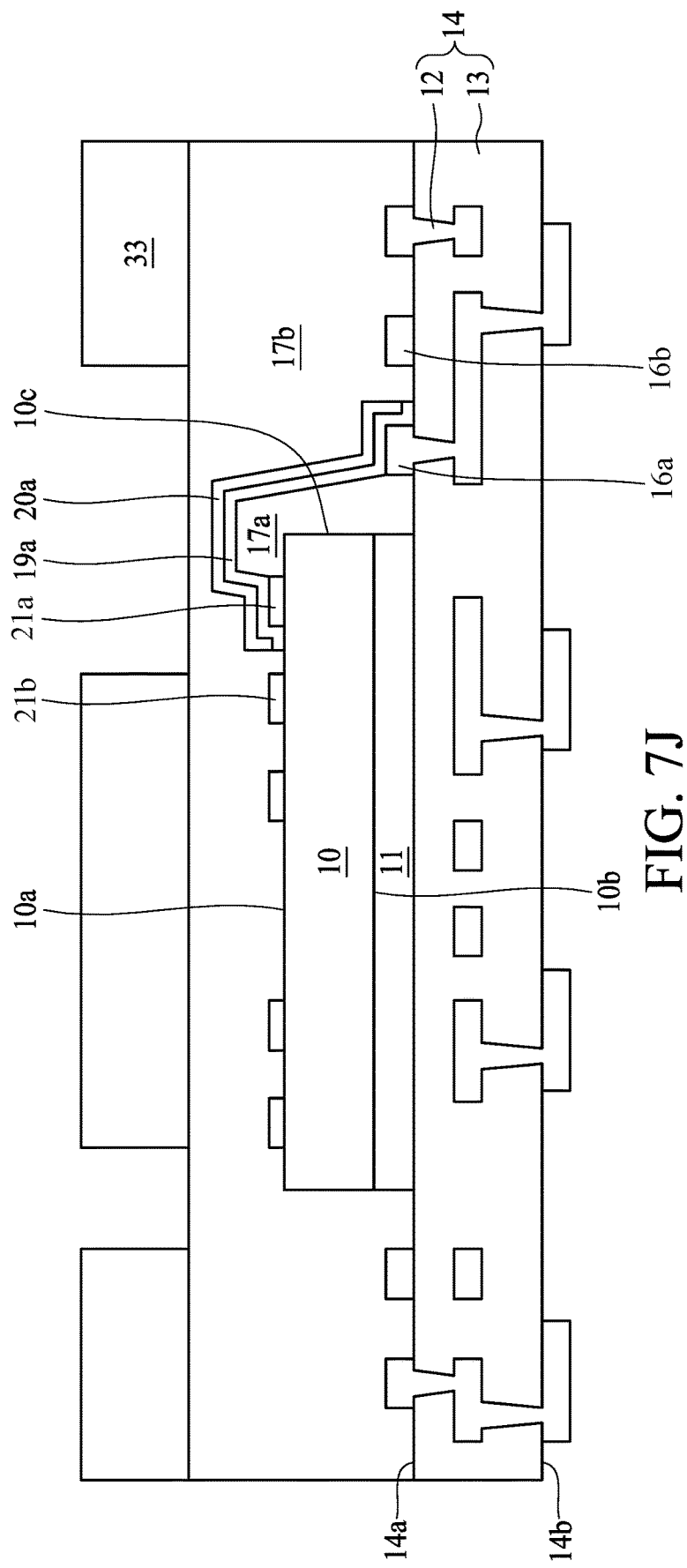
FIG. 7J illustrates one or more stages of a method of manufacturing a semiconductor device package in accordance with some embodiments of the present disclosure.

Referring to FIG. 7J, an isolation layer 17b is formed on the substrate 14. Then, a photoresist film 33 is formed on the isolation layer 17b and is patterned to expose portions of the isolation layer 17b.

Figure 7K:
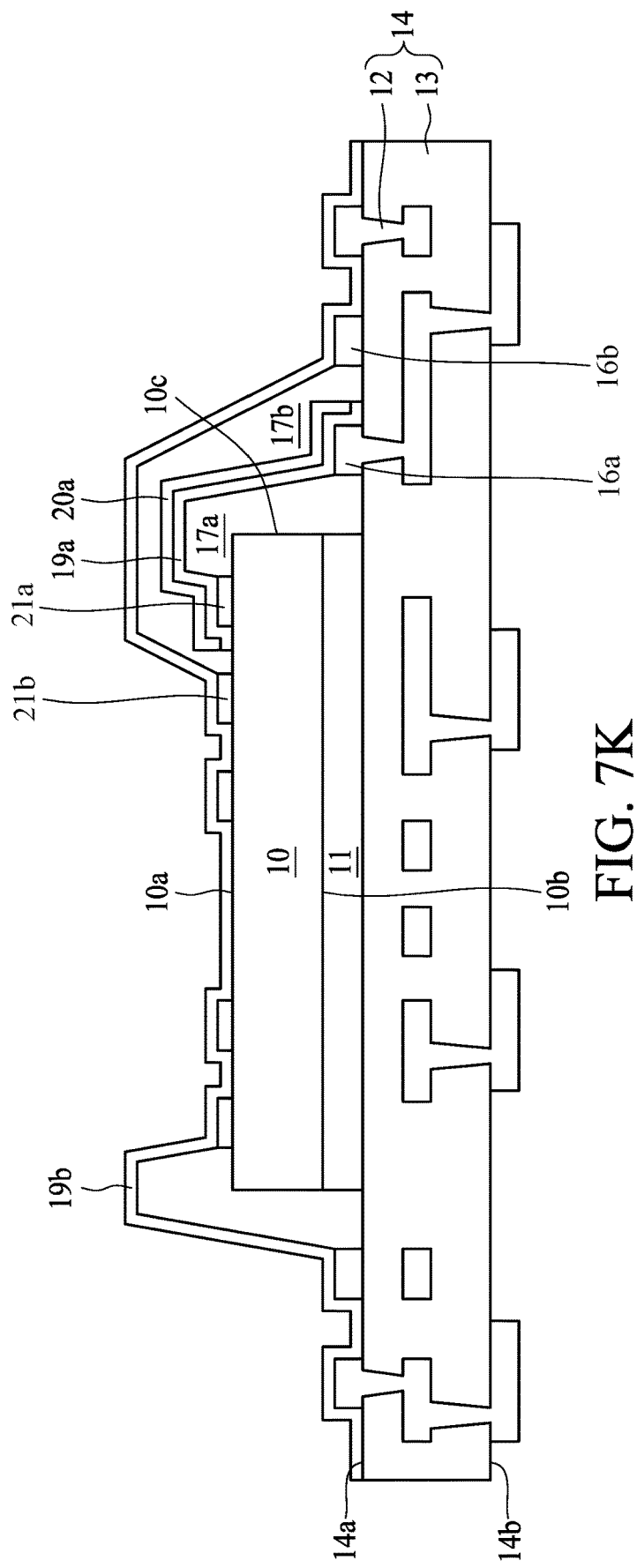
FIG. 7K illustrates one or more stages of a method of manufacturing a semiconductor device package in accordance with some embodiments of the present disclosure.

Referring to FIG. 7K, the photoresist film 33 is removed and the isolation layer 17b covered by the photoresist film 33 is removed, forming the remaining isolation layer 17b. The remaining isolation layer 17b covers the metal layer 20a. Then, a seed layer 19b is conformally disposed on the remaining isolation layer 17b. The seed layer 19b is also conformally disposed on the exposed top surface 14a, the exposed active surface 10a, the conductive pad 16b and the electrical contact 21b.

Figure 7L:
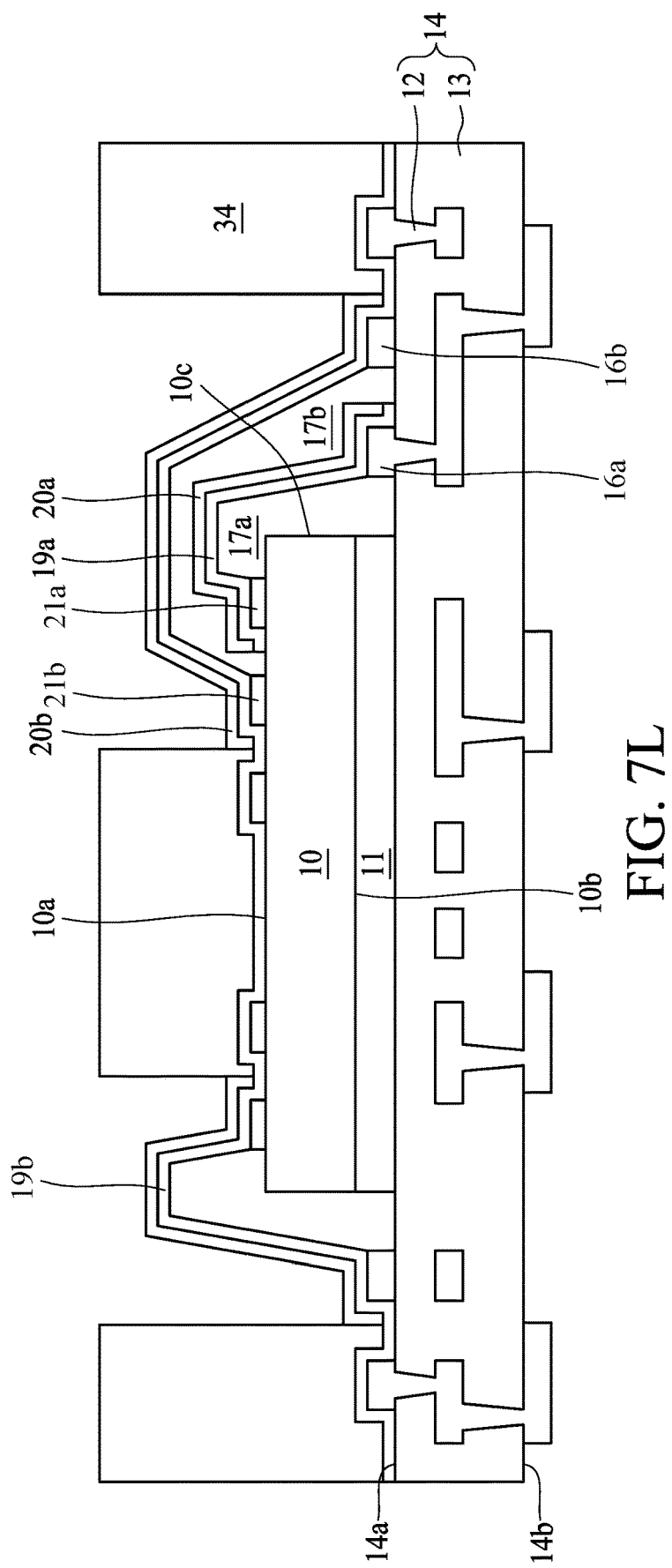
FIG. 7L illustrates one or more stages of a method of manufacturing a semiconductor device package in accordance with some embodiments of the present disclosure.

Referring to FIG. 7L, a photoresist film 34 is formed on the seed layer 19b and is patterned to expose portions of the seed layer 19b. Then, a metal layer 20b is disposed on the exposed seed layer 19b.

Figure 7M:
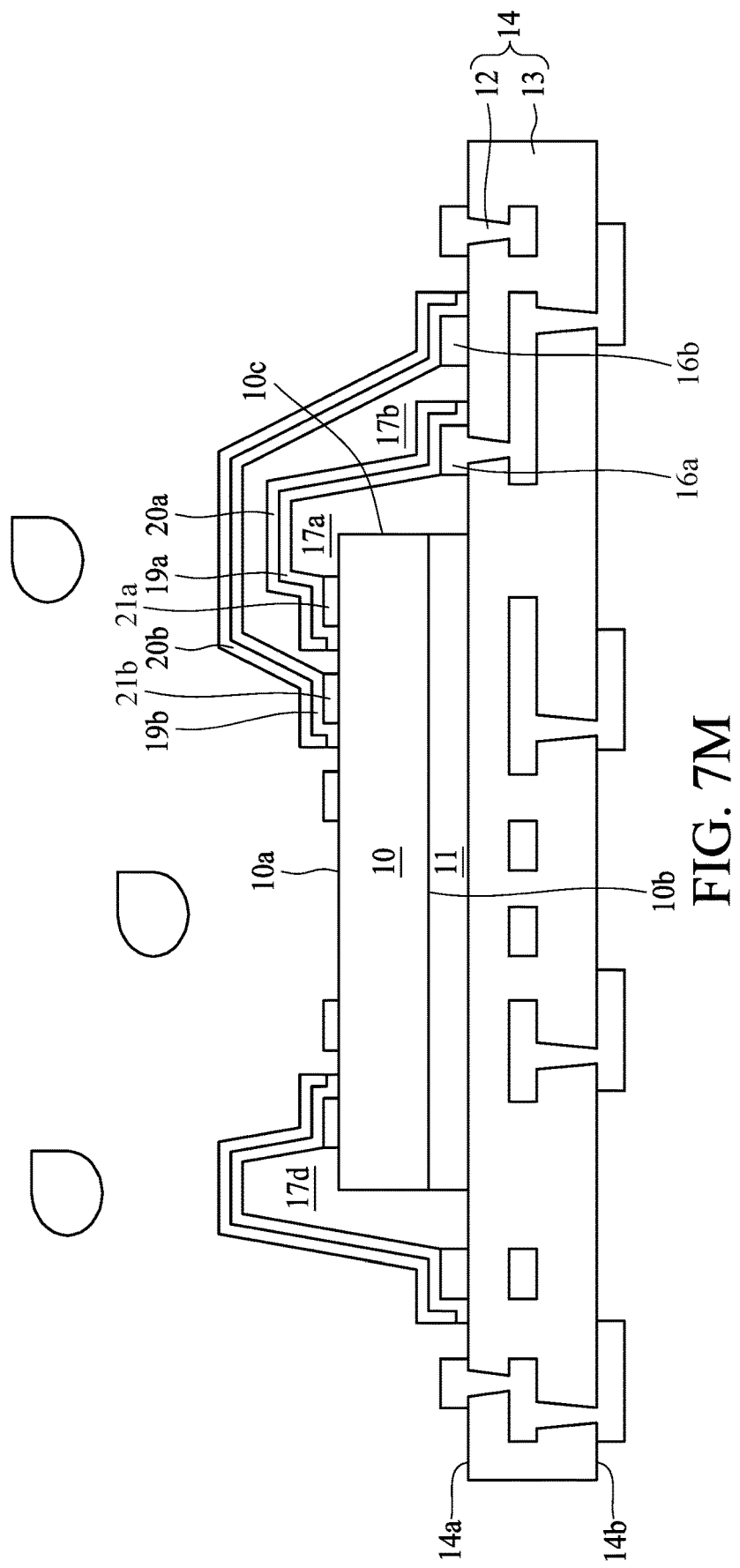
FIG. 7M illustrates one or more stages of a method of manufacturing a semiconductor device package in accordance with some embodiments of the present disclosure.

Referring to FIG. 7M, the photoresist film 34 and the seed layer 19b covered by the photoresist film 34 are removed, forming the remaining seed layer 19b.

As shown in FIG. 7M, the seed layer 19b and the metal layer 20b together form an electrical connection between the conductive pad 16b and the electrical contact 21b.

Figure 7N:
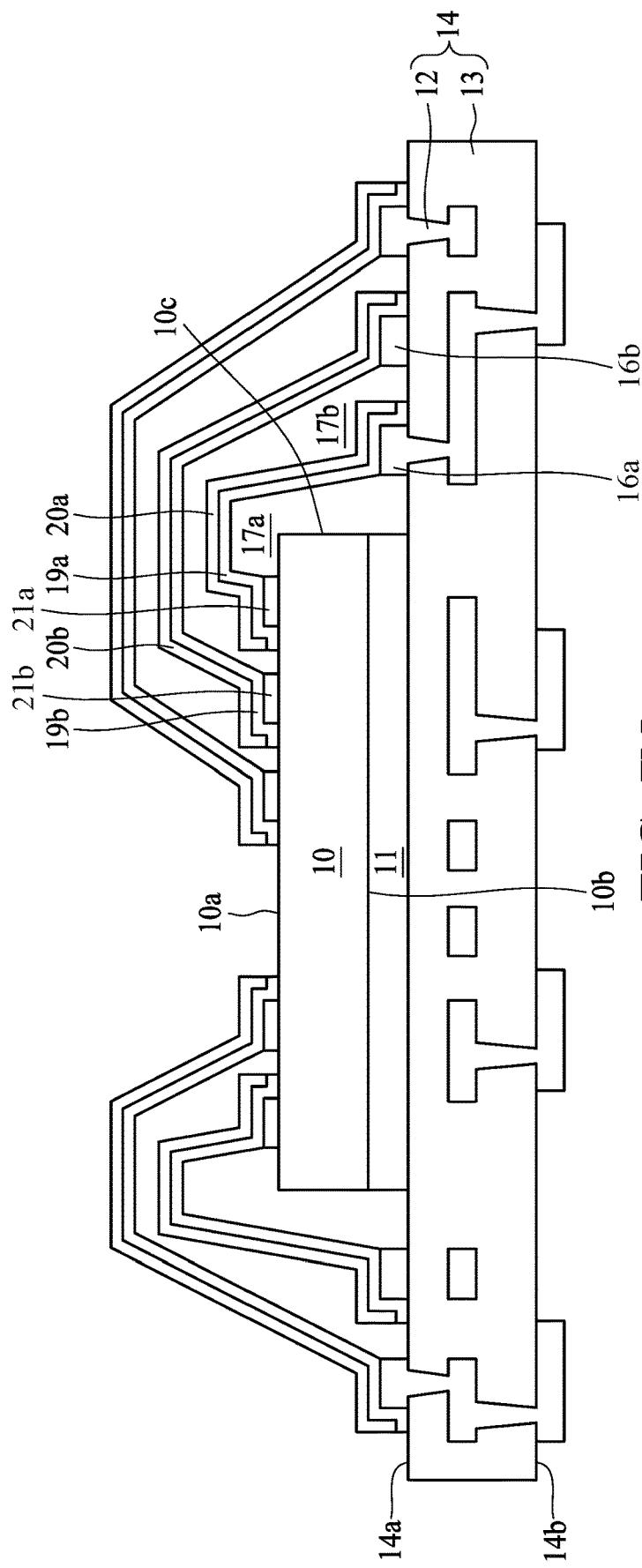
FIG. 7N illustrates one or more stages of a method of manufacturing a semiconductor device package in accordance with some embodiments of the present disclosure.

In some embodiments, more than one isolation layers may be formed in one operation. In some embodiments, more than one seed layers may be formed in one operation. In some embodiments, more than one metal layers may be formed in one operation. In some embodiments, the operations for the formation of the seed layers, and the metal layers, and the isolation layers may be repeatedly performed more times to form more electrical connections between the conductive pads on the substrate 14 and the electrical contacts on the electronic component 10, such as shown in FIG. 7N. The formation of the seed layers, and the metal layers, and the isolation layers are performed layer-by-layer, and the risk of breaking bonding wires is eliminated.

Figure 7O:
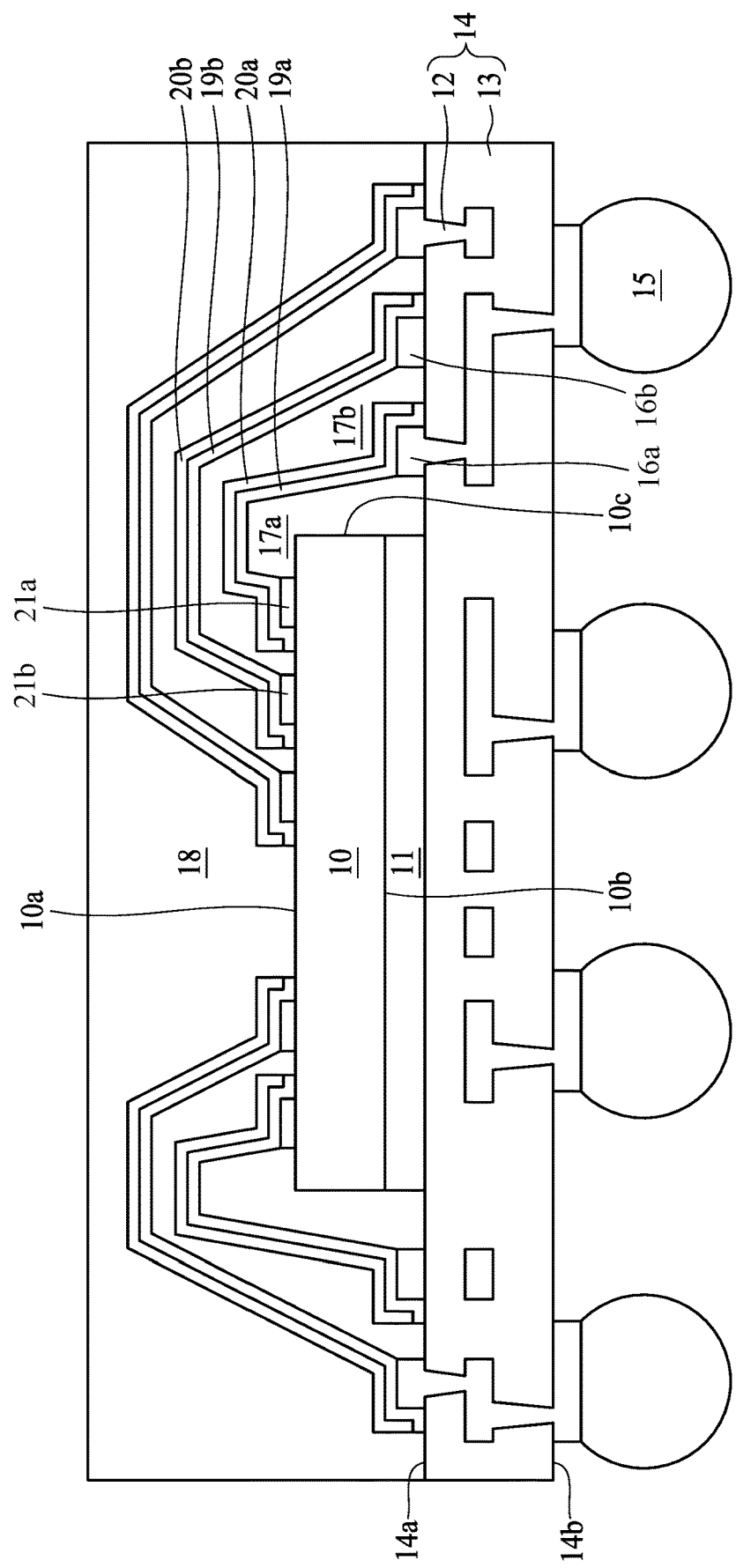
FIG. 7O illustrates one or more stages of a method of manufacturing a semiconductor device package in accordance with some embodiments of the present disclosure.

Referring to FIG. 7O, an encapsulating layer 18 is formed on the substrate 14 to cover or encapsulate the electronic component 10. In some embodiments, the encapsulating layer 18 may be formed by a molding technique, such as transfer molding or compression molding. In some embodiments, a singulation may be performed to separate out individual semiconductor device package devices. The singulation may be performed, for example, by using a dicing saw, laser or other appropriate cutting technique. In some embodiments, one or more electrical contacts 15 may be provided on the back surface 14b of the substrate 14.

Figure 8B:
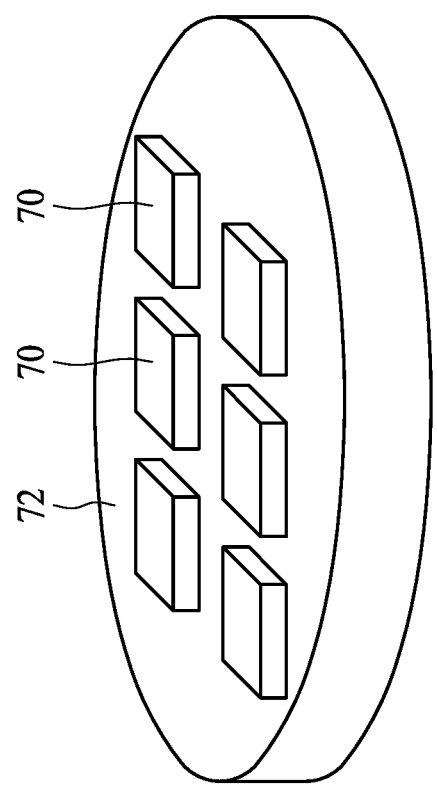
FIG. 8B illustrates examples of various types of semiconductor device packages in accordance with some embodiments of the present disclosure.
Figure 8A:
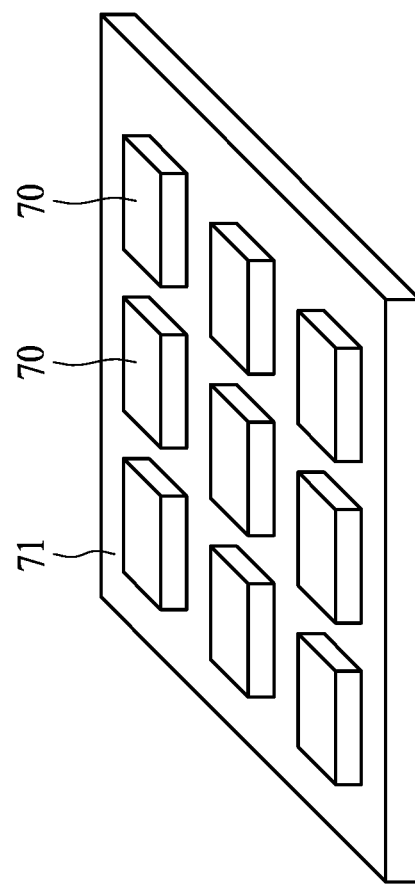
FIG. 8A illustrates examples of various types of semiconductor device packages in accordance with some embodiments of the present disclosure.

FIG. 8A and FIG. 8B illustrate examples of different types of semiconductor device packages in accordance with some embodiments of the present disclosure.

As shown in FIG. 8A, a plurality of chips 70 and/or dies are placed on a square-shaped carrier 71. In some embodiments, the chips 70 may include at least one of the semiconductor device packages 1-10 as shown in FIGS. 1A, 2A, 2B, 2C, 3, 4, 5, 6A, 6C, 6D. In some embodiments, the carrier 71 may include organic materials (e.g., a molding compound, a bismaleimide triazine (BT), a PI, a PBO, a solder resist, an Ajinomoto build-up film (ABF), a polypropylene (PP), an epoxy-based material, or a combination of two or more thereof) or inorganic materials (e.g., silicon, a glass, a ceramic, a quartz, or a combination of two or more thereof).

As shown in FIG. 8B, a plurality of chips 70 and/or dies are placed on a circle-shaped carrier 72. In some embodiments, the carrier 72 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a substrate having a first conductive pad;
   a first electronic component disposed on the substrate, the first electronic component having a first active surface facing away from the substrate;
   a second electronic component disposed on the first active surface of the first electronic component, the second electronic component having a second active surface facing away from the first electronic component, the second electronic component having an electrical contact disposed on the second active surface;
   a first metal layer connecting the electrical contact of the second electronic component with the first conductive pad, wherein the first metal layer is isolated from the first electronic component;
   an isolation layer disposed between the first metal layer and the first electronic component; and
   a first seed layer disposed between the isolation layer and the first metal layer, wherein the first seed layer is in contact with the isolation layer and the first metal layer.

2. The semiconductor device package as claimed in claim 1, further comprising:
   a second metal layer electrically connecting the first electronic component with a second conductive pad of the substrate.

3. The semiconductor device package as claimed in claim 2, wherein the first metal layer and the second metal layer cross each other.

4. The semiconductor device package as claimed in claim 1, wherein the isolation layer is in contact with at least a portion of the first active surface and a lateral surface of the first electronic component.

5. The semiconductor device package as claimed in claim 1, further comprising an encapsulating layer covering the first electronic component, the second electronic component, and the first metal layer.

6. The semiconductor device package as claimed in claim 1, wherein the first seed layer is in contact with the electrical contact of the second electronic component and the first conductive pad of the substrate.

7. The semiconductor device package as claimed in claim 2, further comprising:
a second seed layer disposed below the second metal layer.

8. The semiconductor device package as claimed in claim 7, wherein the first seed layer and the second seed layer cross each other.

9. A semiconductor device package, comprising:
a substrate;
a first electronic component disposed on the substrate, the first electronic component having a first active surface facing away from the substrate;
a second electronic component disposed on the first active surface of the first electronic component, the second electronic component having a second active surface facing away from the first electronic component;
a first metal layer electrically connecting the second electronic component with the substrate, wherein the first metal layer is isolated from the first electronic component;
a first seed layer electrically connecting the second electronic component with the substrate;
a second metal layer electrically connecting the first electronic component with the substrate;
a second seed layer electrically connecting the first electronic component with the substrate; and
a first isolation layer disposed between the first seed layer and the second metal layer.

10. The semiconductor device package as claimed in claim 9, wherein the first seed layer is in contact with the first metal layer.

11. The semiconductor device package as claimed in claim 9, wherein the first isolation layer is in contact with the first seed layer and the second metal layer.

12. The semiconductor device package as claimed in claim 9, wherein the first seed layer is conformally disposed on the first isolation layer.

13. The semiconductor device package as claimed in claim 9, further comprising:
a second isolation layer disposed between the first isolation layer and the first electronic component.

14. The semiconductor device package as claimed in claim 9, wherein the first metal layer and the second metal layer are partially overlapping from a top view perspective.

15. The semiconductor device package as claimed in claim 9, wherein the first seed layer and the second seed layer are partially overlapping from a top view perspective.

* * * * *